(12) United States Patent
Stipe

(10) Patent No.: US 8,169,809 B2
(45) Date of Patent: *May 1, 2012

(54) TREE-STRUCTURE MEMORY DEVICE

(75) Inventor: Barry C. Stipe, San Jose, CA (US)

(73) Assignee: Hitachi Global Storage Technologies, Netherlands B.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/683,422

(22) Filed: Jan. 6, 2010

(65) Prior Publication Data

US 2010/0097834 A1    Apr. 22, 2010

Related U.S. Application Data

(63) Continuation of application No. 12/006,439, filed on Dec. 31, 2007, now Pat. No. 7,663,900.

(51) Int. Cl.
*G11C 5/02* (2006.01)
(52) U.S. Cl. .................. 365/51; 365/63; 365/189.15
(58) Field of Classification Search .................. 365/51, 365/63, 68, 163, 189.14, 189.15
See application file for complete search history.

(56) References Cited

U.S. PATENT DOCUMENTS

| | | | |
|---|---|---|---|
| 6,501,111 B1 | 12/2002 | Lowrey | |
| 6,579,760 B1 | 6/2003 | Lung | |
| 6,990,017 B1 | 1/2006 | Parkinson et al. | |
| 7,042,749 B2 | 5/2006 | Nejad et al. | |
| 7,663,900 B2* | 2/2010 | Stipe | 365/51 |
| 2004/0184331 A1 | 9/2004 | Hanzawa et al. | |
| 2004/0245547 A1 | 12/2004 | Stipe | |
| 2004/0257872 A1 | 12/2004 | Chen et al. | |
| 2005/0030800 A1 | 2/2005 | Johnson et al. | |
| 2005/0041467 A1 | 2/2005 | Chen | |
| 2005/0158950 A1 | 7/2005 | Scheuerlein et al. | |
| 2006/0073652 A1 | 4/2006 | Pellizzer et al. | |
| 2006/0126395 A1 | 6/2006 | Chen et al. | |
| 2006/0280010 A1 | 12/2006 | Hanzawa et al. | |

OTHER PUBLICATIONS

Chen, et al., "Chalcogenide Memory Looks Promising", *EETimes: Global News for the Creators of Technology*, (Sep. 19, 2003),1-4.
Stankiewicz, Steve "Reborn Memory May Put Flash in Shade", *IEEE Spectrum*, (Mar. 2002),1-2.
Hitachi, et al., "Hitachi Global Storage Technologies Outside Counsel Guidelines", *Version 2.0*, (Jun. 2007),1-22.

* cited by examiner

*Primary Examiner* — Alexander Sofocleous
*Assistant Examiner* — Hien Nguyen

(57) ABSTRACT

A tree-structure memory device including a plurality of bit lines formed on a substrate and arranged in at least one plane substantially parallel to a substrate surface and extending substantially in a first direction, a plurality of layers having a plurality of memory cells arranged in a first array, a tree structure corresponding to a plurality of layers and a bit line; and a word-line group including at least one word line crossing with the tree structure, a memory cell of the first array being located at the first intersection region in a layer of said layers.

18 Claims, 9 Drawing Sheets

TREE-STRUCTURE MEMORY DEVICE

RELATED APPLICATIONS

This application is a continuation of and claims the benefit of U.S. patent application Ser. No. 12/006,439 filed on Dec. 31, 2007 entitled "Tree Structure Memory Device,"which has issued as U.S. Pat. No. 7,663,900, by Barry C. Stipe and is assigned to the assignee of the present invention, and is hereby incorporated by reference in its entirety herein.

TECHNICAL FIELD

Embodiments of the present invention relate generally to the field of solid-state memory devices.

BACKGROUND

Currently, three-dimensional (3-D), solid-state memories based on polysilicon diodes and antifuses are beginning to be commercialized and promise to be less expensive than the current low-cost leader in solid-state memory, two bit-per-cell NAND flash memory. 3-D memories increase chip capacity by a large factor over conventional memories. In this way, cost per bit can be significantly reduced. However, vertically stacked memories produced to date have limited application, because they can not be rewritten. Also, only one bit per cell can be stored, because the antifuses are either blown or not-blown.

In one simple approach, a rewritable, variable-resistance memory element would take the place of the antifuses, and would be compatible with a polysilicon diode. Therefore, it is expected that such a memory element would be unipolar with the same direction of current flow for both writing and erasing the memory element, and that it would be able to withstand the high temperatures used for polysilicon diode fabrication. Moreover, it is expected that the current density during operations of writing and erasing the memory cell should not exceed the current-carrying capacity of polysilicon diodes.

Many skilled in the art feel that phase-change memory (PCM) has the best chance to compete with flash memory in the future. Although a PCM is a unipolar, variable-resistance device, it requires a high current during reset, and is not stable at high temperature. In conventional two-dimensional (2-D) PCM, these problems are avoided, because single crystal diodes are grown directly up from the silicon substrate at high temperature before any temperature sensitive phase-change (PC) material is deposited in fabrication. Unfortunately, this approach is not feasible for a vertically stacked memory device, such as a 3-D PCM, because of the temperature sensitivity of the PC material to any subsequently deposited polysilicon in which current-steering elements, e.g. diodes, are formed.

SUMMARY

Various embodiments of the present invention are described herein. A tree-structure memory device comprises a plurality of bit lines formed on a substrate and arranged in at least one plane substantially parallel to a substrate surface and extending substantially in a first direction. A plurality of layers having a plurality of memory cells is arranged in a first array. At least one tree structure corresponds to a plurality of layers and a bit line, and has a trunk portion and at least one branch portion that corresponds to one of the layers. A word-line group includes at least one word line crossing with the branch portion of the tree structure at a first intersection region. A memory cell is located at the first intersection region in a layer of the layers. The first array of memory cells includes at least one memory cell comprising a PC-material layer disposed between the word line and the branch portion of the tree structure at the first intersection region without an intervening current-steering element.

DESCRIPTION OF THE DRAWINGS

The accompanying drawings, which are incorporated in and form a part of this specification, illustrate embodiments of the invention and, together with the description, serve to explain the embodiments of the invention.

The drawings referred to in this description should not be understood as being drawn to scale except if specifically noted.

DESCRIPTION OF EMBODIMENTS

Reference will now be made in detail to the alternative embodiments of the present invention. While the invention will be described in conjunction with the alternative embodiments, it will be understood that they are not intended to limit the invention to these embodiments. On the contrary, the invention is intended to cover alternatives, modifications and equivalents, which may be included within the spirit and scope of the invention as defined by the appended Claims.

Furthermore, in the following description of embodiments of the present invention, numerous specific details are set forth in order to provide a thorough understanding of the present invention. However, it should be appreciated that embodiments of the present invention may be practiced without these specific details. In other instances, well known methods, procedures, and components have not been described in detail as not to unnecessarily obscure embodiments of the present invention.

Figure 1:
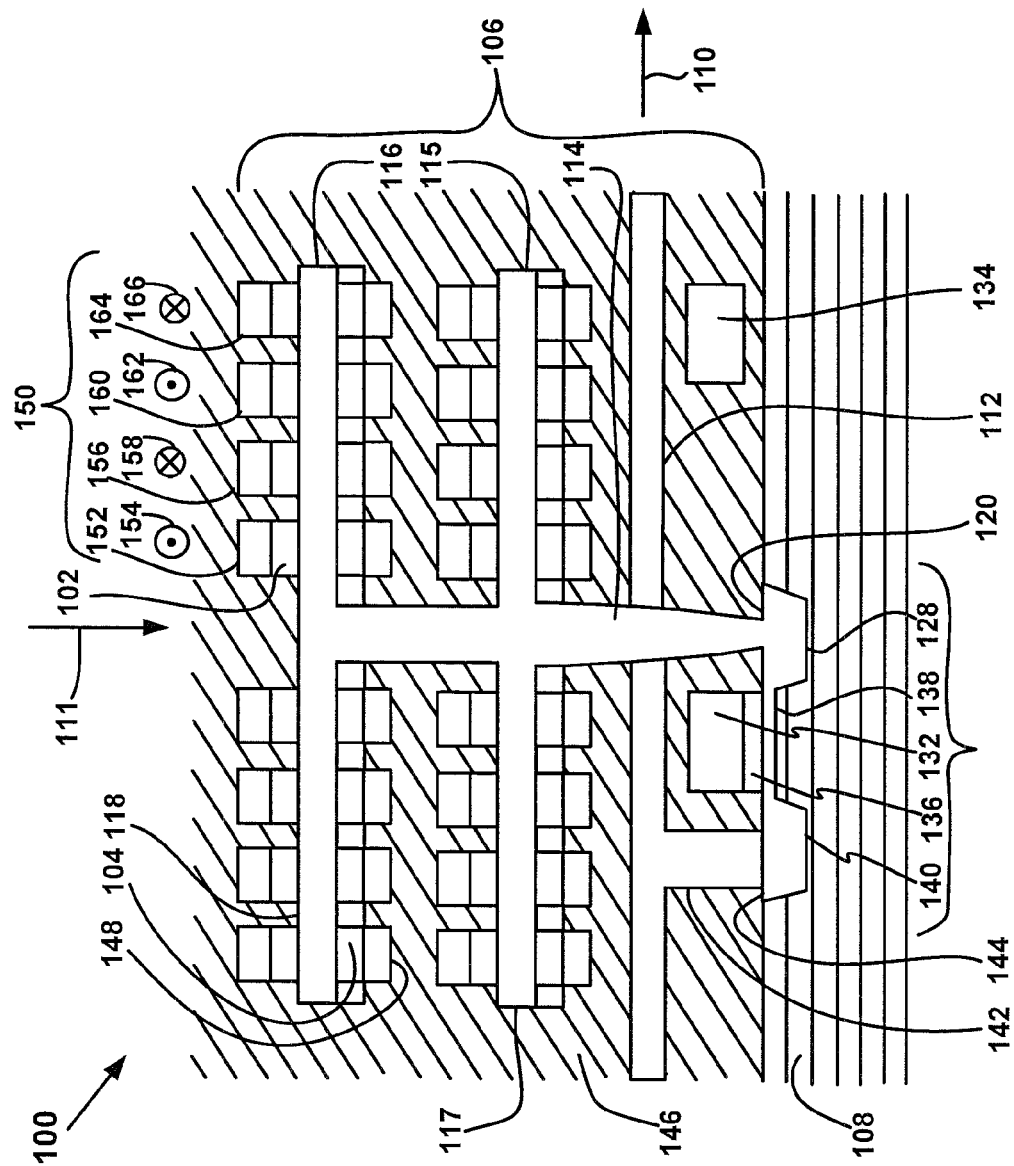
FIG. 1 is a cross-sectional view of a tree structure of a threshold-type, PCM illustrating an embodiment of the present invention.

Physical Description of Embodiments of the Present Invention for a Tree-Structure Memory Device FIG. 1 shows an embodiment of the present invention 100 illustrating a cross-sectional view of a memory cell 102 of a tree-structure memory device, disposed in electrical contact with a tree structure 106. The cross-section, as shown, is substantially perpendicular to a substrate 108 upon which a threshold-type PCM is fabricated, and substantially parallel to a first direction 110 of a branch portion 116 of the tree structure 106 through a center line thereof. As shown in FIG. 1, the tree structure 106 comprises a trunk portion 114 and at least one branch portion 116 electrically connected to the trunk portion 114; and, a bit line 112 formed on the substrate 108 runs generally in a plane substantially parallel to the substrate surface and extending substantially in the first direction 110, but at the cross-over with the trunk portion 114 of the tree structure 106 is offset below the plane of FIG. 1 to avoid interference with the trunk portion 114. The trunk portion 114 is electrically connected by means of a via 120 to a first source/drain 128 of a tree-access transistor 124. Alternatively, the trunk portion 114 may be electrically connected to a plurality of branch portions 115, 116, 117, and 118 corresponding to a plurality of layers in the tree structure 106, for example, as shown in FIG. 1.

As used herein, the terms substantially perpendicular and substantially parallel with respect to fabricated lines and the directions of those lines is defined as being within the tolerances of angular alignment as known in the photolithographic, electron-beam lithographic, or x-ray lithographic arts and their equivalents for fabricating microelectronic devices. Also, as used herein, the term substantially parallel with respect to a substrate surface or layer is defined as being at a nominally fixed spacing along a direction normal to the substrate surface or layer. It should be recognized that being parallel to a surface or layer encompasses the deviations from perfect planarity that accompany roughness artifacts introduced by microfabrication processes as known in the photolithographic, electron-beam lithographic, or x-ray lithographic arts for fabricating microelectronic devices. For example, the undulations in fabricated layers that accompany the passage of layers over underlying lines or via connections are within the scope of the meaning of the term substantially parallel when used with respect to layers herein. Likewise, as used herein, the term substantially perpendicular with respect to a substrate surface or layer is defined as being along a direction about normal to the substrate surface or layer. Also, as used herein, extending substantially in a direction with respect to a fabricated line encompasses deviations from that direction that might be introduced by offsets, and jogs in the routing of a line along a direction, as known in the art, to avoid obstacles that lie in the direction.

As shown, the tree-access transistor 124 may comprise a field effect transistor (FET), which includes the first source/drain 128, a gate 132, a channel 138, and a second source/drain 140 connected to the first source/drain 128 through the channel 138. In one embodiment of the present invention as shown, a portion of a tree-column-select line disposed over the channel 138 may also serve as the gate 132 of the FET; although the tree-column-select line need only be electrically connected to the gate 132, the arrangement shown in which the gate and a portion of the tree-column-select line are in common reduces the number of fabrication steps for the device. Another tree-column-select line 134, which passes under the branch portion 115 of the tree structure 106, is also shown; tree-column-select line 134 provides access to other tree structures (not shown), as will subsequently be described. The FET is fabricated with standard techniques known from the art of integrated circuit (IC) fabrication. The FET may include a gate dielectric 136 (as shown), as for an insulated gate field effect transistor (IGFET); or, it may not include the gate dielectric 136 as for a junction field effect transistor (JFET). In one embodiment of the present invention, the substrate 108 comprises silicon (Si), and the gate dielectric 136 comprises $SiO_2$, as for a metal oxide semiconductor field effect transistor (MOSFET).

An electrical current may flow from the first source/drain 128 through the channel 138 to the second source/drain 140, in which case the first source/drain 128 acts as a drain for electron flow and the second source/drain 140 acts as a source of flowing electrons in the channel 138 of the field effect transistor. On the other hand, if an electrical current flows from the second source/drain 140 through the channel 138 to the first source/drain 128, the second source/drain 140 acts as a drain for electron flow and the first source/drain 128 acts as a source of flowing electrons in the channel 138 of the field effect transistor. Hence, the designation of source/drains, 128 and 140, as such, depending on the direction of the current flow, or electron flow.

Both the tree-column-select line, shown serving as gate 132, and the tree-access transistor 124 provide both read and write functionality in reading or writing data states to memory cells in electrical communication with the tree structure 106, for example, the memory cell 102. Thus, tree-column-select line, shown serving as gate 132, is both a read and a write line, e.g. a read/write line; and, the tree-access transistor 124 is both a read and a write transistor, e.g. a read/write transistor.

With further reference to FIG. 1, the second source/drain 140 of the tree-access transistor 124 is electrically connected to the bit line 112 through a vertical riser portion 142 of the bit line 112 that passes through a via 144. The tree-column-select line overlaps the tree-access transistor 124 at a second intersection region located at the position of the gate 132. Thus, the tree-access transistor 124 is electrically disposed between the tree structure 106 and the bit line 112 corresponding to the second intersection region, and is electrically coupled through the gate 132 to the tree-column-select line corresponding to the second intersection region. As shown, the portion the tree-column-select line lying above the tree-access transistor 124 at a second intersection region serves as the gate 132 of the tree-access transistor 124, the gate 132 being electrically connected to other portions of the tree-column-select line not disposed above the tree-access transistor 124; it should be appreciated that this arrangement does not preclude functionally equivalent embodiments of the present invention where the tree-column-select line and the gate 132 are separate entities without either having portions in common with the other. It should be appreciated that a line-type gate with line-type gate dielectric may be used, in which interference between adjacent transistors can be avoided with proper silicon doped regions. In this case there is no distinction between the gate dielectric 136 and the gap below 134.

With further reference to FIG. 1, the memory cell 102 comprises a PC-material layer. The PC-material layer is disposed between a word line 152 and the branch portion 116 of the tree structure 106 on a top side of the branch at a first intersection region of a plurality of first intersection regions, and is electrically connected to the word line 152 and the branch portion 116 of the tree structure 106 without an intervening current-steering element. It should be appreciated that a means for storing data states in the memory cell 102 comprises an amorphous threshold-type, PC-material portion of a PC-material layer disposed between the word line 152 and the branch portion 116 of the tree structure 106 on the top side of the branch at the first intersection region of the plurality of first intersection regions and electrically connected to the word line 152 and the branch portion 116 of the tree structure 106 without the intervening current-steering element. When viewed down a third direction 111 of an axis of the trunk portion 114, one of a plurality of first intersection regions occurs, for example, at a crossing between the word line 152 and the branch portion 116 of the tree structure 106 in the space in between the word line 152 and the branch portion 116 in a so-called, cross-point array as is known in the art. In another embodiment of the present invention, an intervening thermal insulating barrier (TIB) layer may be disposed in the memory cell 102 between the word line 152 and the branch portion 116 of the tree structure 106 on the top side of the branch at a first intersection region of a plurality of first intersection regions and adjacent to the PC-material layer within memory cell 102. In an embodiment of the present invention, the PC-material exhibits ovonic-threshold-switching behavior when in the amorphous state, so that the PC-material layer may comprise a Ge—Sb—Te (GST) layer or other chalcogenide material layer that exhibits ovonic-threshold-switching behavior when in the amorphous state. Generally, the TIB layer may be either between the GST layer and tree branch or between the GST layer and word line. The TIB layer may comprise tantalum oxide ($Ta_2O_5$) or other similar material having low thermal conductivity, but reasonable electrical conductance and, the branch portions and trunk portions of tree structures, as well as word lines, may comprise a suitable refractory metal such as tungsten (W). It should be appreciated that $Ta_2O_5$ is an electrical insulator, but can have reasonable tunneling conductance when made thin, about 2 nanometers (nm).

Alternatively, a memory cell 104 comprises another PC-material layer. The PC-material layer is disposed between a word line 148 and the branch portion 118 of the tree structure 106 on the bottom side of the branch at another first intersection region of a plurality of first intersection regions, and is electrically connected to the word line 148 and the branch portion 118 of the tree structure 106 without an intervening current-steering element. When viewed down the third direction 111 of an axis of the trunk portion 114, one of a plurality of first intersection regions occurs, for example, at a crossing between the branch portion 118 of the tree structure 106 and the word line 148 in the space in between the word line 148 and the branch portion 118 in a so-called, cross-point array as is known in the art. Because the tree structure 106 may comprise a plurality of overlapping branch portions in a plurality of layers, and the word lines comprise a plurality of word lines crossing with the branch portions in another plurality of layers, the plurality of first intersection regions lay in a plurality of layers between respective branch portion layers and word-line layers having PC-material layers disposed therebetween. In another embodiment of the present invention, an intervening thermal insulating barrier layer may be disposed between the word line 148 and the branch portion 118 of the tree structure 106 on the bottom side of the branch portion 118 or on the top side of the word line 148 at another first intersection region of a plurality of first intersection regions. It should be appreciated that there are alternative arrangements for the disposition of memory cells with respect to a branch portion, e.g. the branch portion 118, which may be selected from the group of arrangements consisting of a memory cell above a branch portion, a memory cell below a branch portion, and combinations of arrangements of a memory cell above and a memory cell below a branch portion.

In another embodiment of the present invention, a word-line group 150 including an at least one word line 152 crosses with and overlaps the branch portion 116 of the tree structure 106 at a first intersection region. The memory cell 102 is located in the space in between the word line 152 and the branch portion 116 at a first intersection region in a layer. The word-line group 150, as shown in FIG. 1, comprises word lines 152, 156, 160, and 164; and at least a portion of the space lying between these word lines and the branch portion 116 is occupied by a PC-material layer being disposed therebetween. A tree-branch-portion of an array of memory cells comprises a PC-material layer disposed in the space lying between the word-line group 150 and the branch portion 116 of the tree structure 106 without intervening current-steering elements, as shown. As described above, a plurality of word lines and branch portions of the tree structure 106 may cross with one another to form a plurality of tree-branch-portions of an array of memory cells in the spaces lying between the word-line groups and the branch portions of the tree structure 106 thereby forming a tree-portion of an array of memory cells. As shown in FIG. 1, 32 word lines in 8 word-line groups and 4 branch portions of the tree structure 106 form 32 memory cells in 4 PC-material layers in the spaces therebetween; the resulting 4 tree-branch-portions of a first array 301, the memory-cell array, form a tree-array of memory cells. As will be discussed further below, the first array 301 of memory cells comprises a plurality of tree-arrays of memory cells of corresponding tree structures. It should be appreciated that the PC-material portions of layers disposed between the word-line layers and the branch portion layers constitute a 3-D array of vertically stacked memory cells situated on the cross-points between word lines and branch portions of tree structures.

As explained above, the first array 301, the memory-cell array, comprises a plurality of layers several of which carry electrical currents. To isolate these current carrying layers comprising pluralities of: bit lines, word lines, PC-material layers, tree-column-select lines, tree-access transistors, from each other and the substrate 108, as well as to insulate the tree trunks and bit lines from one another, the various layers are separated and encapsulated in dielectric material 146. This dielectric material 146 may comprise field oxides of $SiO_2$ grown on the Si substrate, deposited layers of dielectric material such as sputtered or chemically vapor deposited (CVD) $SiO_2$, or sputtered $Al_2O_3$, as is known in the art of IC fabrication.

In accordance with an embodiment of the present invention, word lines in the word-line group 150 are disposed in a second direction 154 substantially perpendicular to the first direction 110. As shown in FIG. 1, word-line group 150 comprises word lines 152, 156, 160, and 164; these word lines run respectively in second directions 154, 158, 162, and 166 substantially perpendicular to first direction 110, as indicated by respective arrow heads and arrow tails in FIG. 1. The arrow heads on 154 and 162 indicate that the respective word lines 152 and 160 run outwards from the plane of FIG. 1 electrically connecting to word-line-driver transistors at the back side of the first array 301 of memory cells in back of the plane of FIG. 1 in a portion of the substrate 108 at the periphery of the first array 301 of memory cells. The arrow tails on 158 and 166 indicate that the respective word lines 156 and 164 run inwards into the plane of FIG. 1 electrically connecting to word-line-driver transistors at the front side of the first array 301 of memory cells in front of the plane of FIG. 1 in another portion of the substrate 108 at the periphery of the first array 301 of memory cells. The word-line-driver transistors form a second array, comprising sub-arrays located at the front side and the back side of the first array 301 of memory cells. A first sub-array is located at the front side of the first array 301 of memory cells; and, a second sub-array is located at the back side of the first array 301 of memory cells. In an alternative embodiment of the present invention, a 32-wire array (bus) (with 16-wires on each side of the array) may provide signals to the word-line-driver transistors so that the vertical interconnects at the end of the word lines form a diagonal (not shown) connecting independently to the 32-wire array (bus); this arrangement permits each word line in a tree column to be independently controlled at the same time (not floated). The word lines of a word-line group form an interleaved pattern, so that adjacent word lines run in opposite directions to corresponding word-line-driver transistors of respective sub-arrays. The interleaving of the word lines allows for a 4F lateral spacing of the vertical interconnects and the use of la0072ger dimensions for these vertical interconnects. Interleaving of the word lines also allows for a relaxed 4F lateral pitch in the work line driver transistors. Alternatively, all word lines may run in the same direction and connect to a single array of word-line-driver transistors; in this case, care needs to be taken to route word lines around adjacent vertical interconnections without interference. In this case, the 32-wire array providing signals to the word-line-drivers would be all on one side of the memory array.

Figure 2:
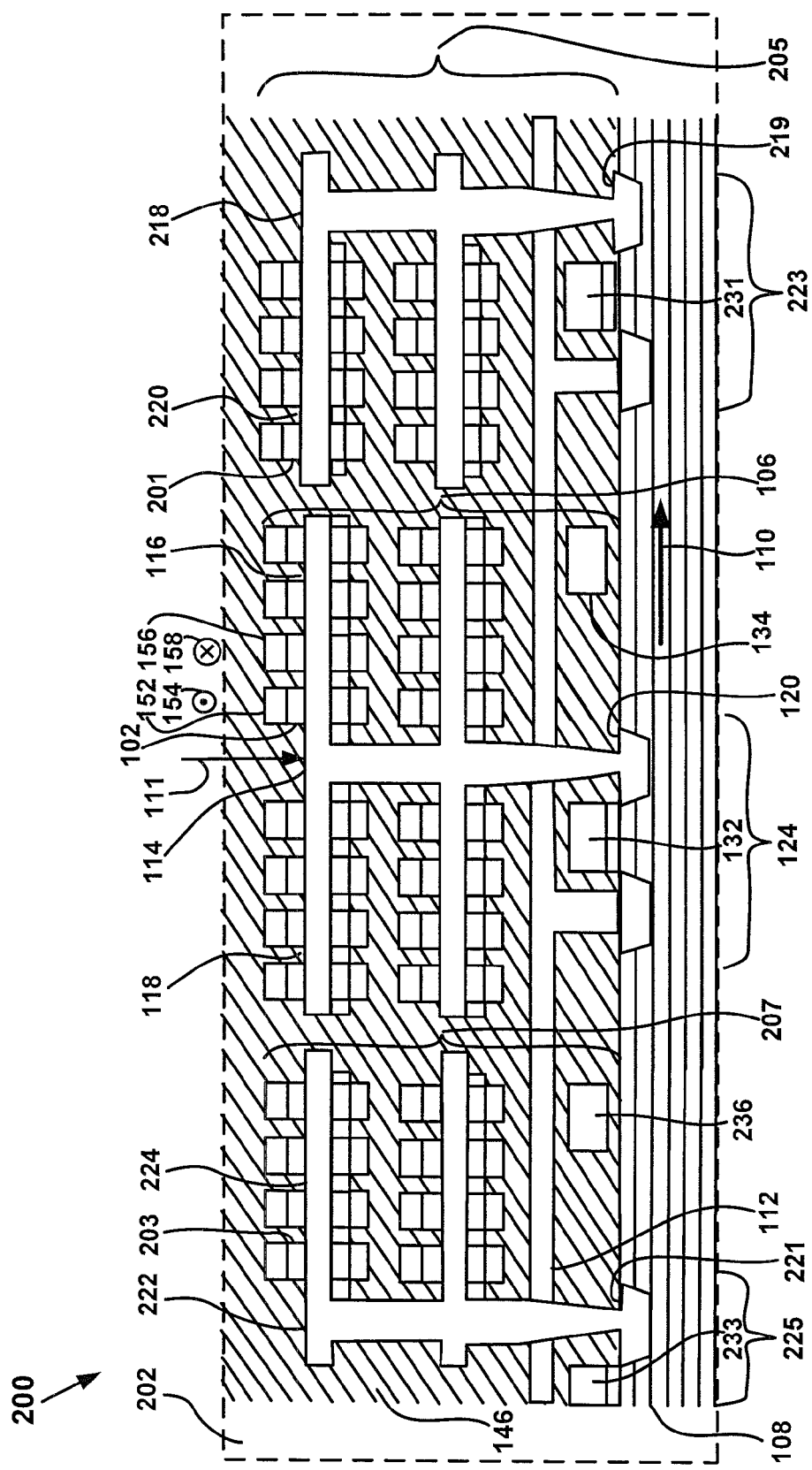
FIG. 2 is a cross-sectional view of a portion of a tree row containing tree structures of a threshold-type, PCM illustrating another embodiment of the present invention.

Referring now to FIG. 2, according to an embodiment of the present invention 200, it will be recognized that the tree structure 106 is shown, as well as adjacent tree structures 205 and 207; tree structures 205, 106, and 207 are arranged in a row, e.g. a tree row 202, that runs substantially parallel to the first direction 110 and have the bit line 112 in common, which serves as a tree-row-select line. FIG. 2 shows a cross-section through a representative portion of the tree row 202 through one complete tree structure 106 and two other partial tree structures 205 and 207. The cross-section through a center line of the tree structure 106, as shown, is substantially perpendicular to the substrate 108 upon which the threshold-type PCM is fabricated, and substantially parallel to the first direction 110 of the branch portion 116 of the tree structure 106. Also, the cross-section is substantially perpendicular to second directions 154 and 158 of word lines 152 and 156 that run in opposite second directions as indicated by the arrow head and arrow tail symbols, respectively, while the third direction 111 of an axis of the trunk portion 114 is substantially perpendicular to the substrate 108 and to the first direction 110. As shown in FIG. 2 and discussed above with reference to FIG. 1, the tree structure 106 comprises the trunk portion 114 and at least one branch portion 116 electrically connected to the trunk portion 114; and, the bit line 112 runs generally in a plane substantially parallel to that of the section, but at the cross-over with the trunk portion 114 of the tree structure 106 is offset below the plane of FIG. 1 to avoid interference with the trunk portion 114. Representative of other tree structures in the tree row 202, the partial tree structures 205 and 207 similarly comprise respective trunk portions 218 and 222 and at least one respective branch portions 220 and 224 electrically connected to respective trunk portions 218 and 222. The center lines of respective branch portions 220 and 224 of the tree structures 205 and 207 also run substantially parallel to the first direction 110 of the branch portion 116 of the tree structure 106. Thus, a row of tree structures, e.g. the tree row 202, lies in a line along the first direction 110.

The respective trunk portions 218, 114, and 222 of the tree structures 205, 106, and 207, representative of a row of tree structures, e.g. the tree row 202, are electrically connected by means of respective vias 219, 120 and 221 to source/drains of a tree-access transistors 223, 124, and 225 (the latter 225 not shown in its entirety.) The vias 219, 120 and 221 connecting to the tree trunks thus lie in a row along the substrate 108 substantially parallel to the first direction 110. In an embodiment of the present invention maximizing the bit-cell density along the tree row 202, the tree-structure via spacing along the tree row 202 for optimum packing of memory cells having 4 memory cells on the top of a branch portion, e.g. the branch portion 116, as shown in FIG. 2, is 20F along the first direction 110, where F is the lithographic half pitch determined by the resolution of lithographic tooling used to fabricate the tree-structure memory device. It should be appreciated that F may be 90 nm, or less.

With further reference to FIG. 2, respective tree-column-select lines 231 and 233 (233 not shown in its entirety) and the tree-column-select line shown serving as gate 132 provide access to tree structures 205, 207 and 106 in the tree row 202 through respective tree-access transistors 223, 225 and 124. Tree-column-select lines 231 and 233 and the tree-column-select line shown serving as gate 132 are representative of tree-column-select lines providing access to the tree row 202, and are on a spacing of 20F along the first direction 110 per the memory-cell ground rules illustrated in FIG. 2. Also, tree-column-select lines 134 and 236 serve to access tree rows other than tree row 202 that are substantially parallel to the tree row 202. For the lithography ground rules shown in FIG. 2, the spacing of tree-column-select lines 134 and 236 is also 20F along the first direction 110.

With further reference to FIG. 2, the tree-column-select lines 134 and 236 are on a 20F spacing along the first direction 110 like tree-column-select lines 231 and 233 and the tree-column-select line shown serving as gate 132 that connect to the tree row 202. Likewise, tree-column-select lines 134 and 236 connect to a tree row (not shown) that is substantially parallel and adjacent to the tree row 202. However, from FIG. 2, it is seen that the tree-column-select lines 134 and 236 are offset in position from the tree-column-select lines 231 and 233 and the tree-column-select line shown serving as gate 132 of the tree row 202 by a spacing of 10F along the first direction 110. Consequently, the tree-column-select lines 134 and 236 couple electrically with the channels of corresponding tree-access transistors of an adjacent tree row that are also offset by a spacing of 20F along the first direction 110 from tree-access transistors 223, 124, and 225 of the tree row 202. Thus, the source/drains of the corresponding tree-access transistors of the adjacent tree row to which tree trunks of the tree structures in the adjacent tree row are electrically connected are likewise offset by 10F along the first direction 110 from the source/drains of the tree-access transistors 223, 124, and 225. Consequently, the vias through which tree structures of an adjacent tree row make contact to the source/drains of corresponding tree-access transistors are offset from those of the tree row 202 by a spacing of 10F along the first direction 110. However, the spacing between successive vias of successive tree structures of an adjacent tree row is 20F along the first direction 110, just as the tree-column-select lines 134 and 236. Thus, the spacing of tree structures supporting the memory cells of an adjacent tree row is 20F along the first direction 110.

Figure 3:
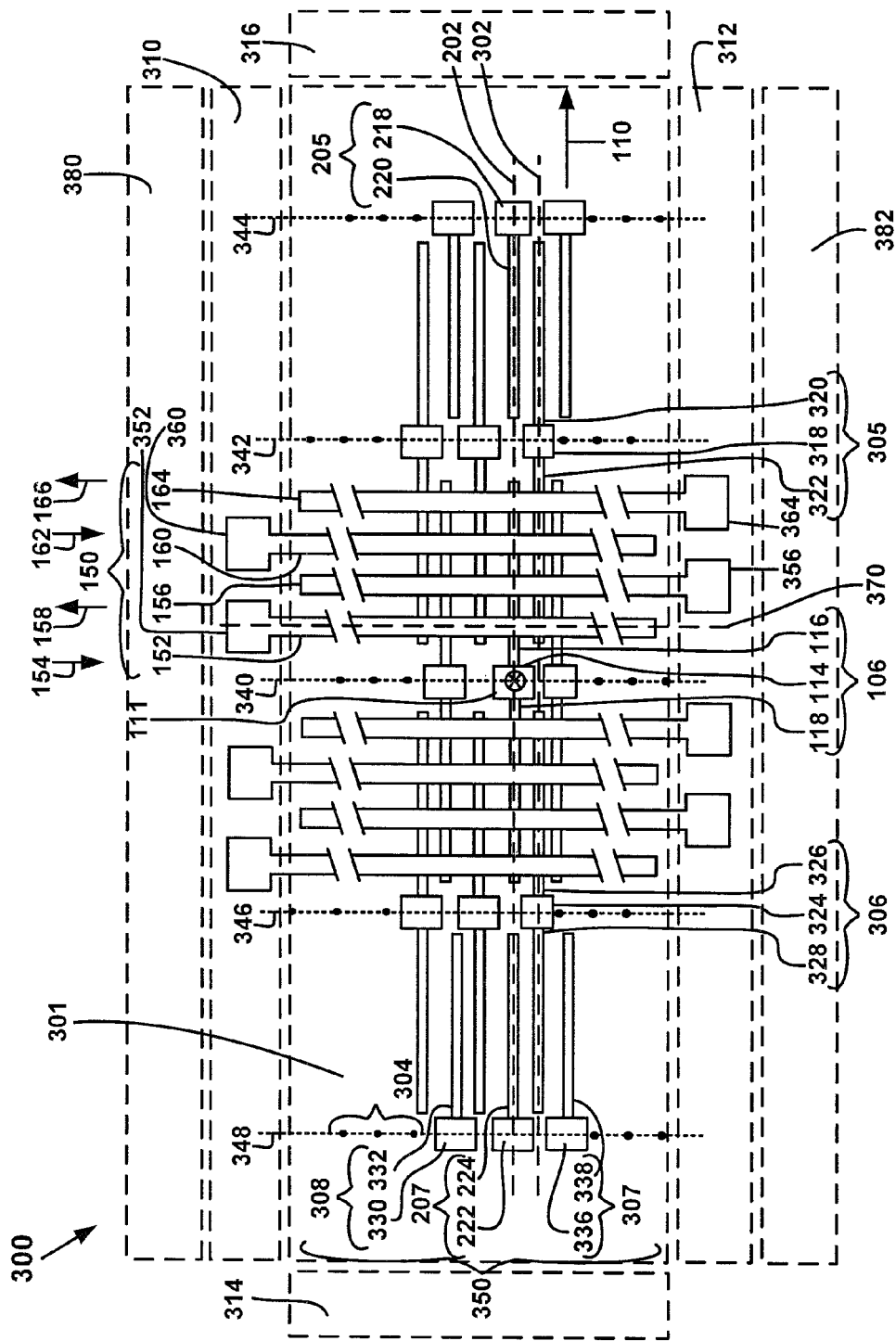
FIG. 3 is a plan view of a tree structure of a threshold-type, PCM corresponding to that shown in FIG. 2 showing the disposition of a tree structure in a first array of PCM cells illustrating an embodiment of the present invention.

Turning now to FIG. 3 to illustrate the lithographic ground rules between adjacent tree rows in the first array 301 of memory cells along the second direction 154, a plan view as viewed down the third direction 111 shows the spacing of adjacent tree rows along the second direction 154, and the first direction 110 in an embodiment of the present invention 300. For ease of discussion, the first array 301 of memory cells is shown schematically as an enlarged view of representative tree structures with only some of the word-line groups shown and without intervening dielectric material 146 to elucidate the relative position of word lines disposed relative to branch portions of the tree structures in relationship to the memory cells disposed therebetween. Tree structure 106 may comprise the branch portion 116, the branch portion 118, and the trunk portion 114. Tree structure 205 may comprise at least one branch portion 220 and a trunk portion 218. Tree structure 207 may comprise at least one branch portion 224 and a trunk portion 222. Although a tree structure may comprise a plurality of branch portions arranged in successive vertically stacked layers, FIG. 3 shows only the top most layer of the branch portions of the tree structures shown, for ease of illustration. Tree structures 205, 106, and 207 comprise a portion of tree row 202 that runs substantially parallel to the first direction 110.

Again with reference to FIG. 3, tree structure 305 may comprise a branch portion 320, a branch portion 322, and a trunk portion 318. Tree structure 306 may comprise a branch portion 326, a branch portion 328, and a trunk portion 324. Likewise, tree structures 305, and 306 comprise a portion of tree row 302 adjacent to tree row 202 and offset from tree row 202 by a spacing of 2F in the second direction 154 that is directed towards the front side of the array of memory cells. Also, tree row 302 runs substantially parallel to the first direction 110, thus running substantially parallel to tree row 202. As shown in FIG. 3, dashed lines on the tree rows 202 and 302 show the nominal location of the center lines of successive tree rows offset with a spacing of 2F along the second direction 154. Also, tree row 302 is offset from tree row 202 by a spacing of 10F along the first direction 110, which facilitates interleaving the tree structures on adjacent tree rows, the tree structures in both tree rows 202 and 302 being spaced in succession with a spacing of 20F along the first direction 110.

In another embodiment of the present invention, tree structures are arranged in columns. As shown in FIG. 3, tree structure 307 may comprise at least one branch portion 338 and a trunk portion 336. Tree structure 308 may comprise at least one branch portion 332 and a trunk portion 330. Tree structures 307, 207, and 308 comprise a portion of tree column 348 that runs substantially parallel to the second direction 154. The ellipsis 304 indicates that the tree column 348 may include many other successive tree structures (not shown) in the tree column 348. Tree columns, e.g. tree columns 340, 342, 344, 346 and 348, are arranged in a staggered fashion with a spacing of 10F along the first direction 110 with the trunk portions of respective adjacent tree columns, e.g. tree columns 340 and 342, offset by a spacing of 4F in the second direction 154, because successive tree rows, e.g. tree row 202 and tree row 302, in a tree column are offset with a spacing of 4F along that same direction. As shown in FIG. 3, ellipses at the front sides and the back sides of successive tree columns 348, 346, 340, 342 and 344 show the nominal location of the center lines of successive tree columns 348, 346, 340, 342 and 344.

With reference to FIG. 3, it should be appreciated that the tree-structure memory device includes a first plurality of tree structures, e.g. tree structures 308, 207 and 307, that are arranged in a first tree column, e.g. tree column 348, and the trunk portion, e.g. trunk portion 222, of the tree structure, e.g. tree structure 207, in the first tree column, e.g. tree column 348, is displaced from a first adjacent trunk portion, e.g. trunk portion 330, of a first adjacent tree structure, e.g. tree structure 308, in the first tree column, e.g. tree column 348, by a spacing of 4F. Also, a second plurality of the tree structures, e.g. tree structures 207, 106 and 205, are arranged in a tree row, e.g. tree row 202; and the trunk portion, e.g. trunk portion 222, of the tree structure, e.g. tree structure 207, in the tree row, e.g. tree row 202, is located in the first tree column, e.g. tree column 348; and a second adjacent trunk portion, e.g. trunk portion 324, of a second adjacent tree structure, e.g. tree structure 306, in an adjacent tree row, e.g. tree row 302, is located in a second tree column, e.g. tree column 346. In addition, the trunk portion, e.g. trunk portion 222, of the tree structure, e.g. tree structure 207, in the tree row, e.g. tree row 202, located in the first tree column, e.g. tree column 348, is offset from the second adjacent trunk portion, e.g. trunk portion 324, of the second adjacent tree structure, e.g. tree structure 306, in the adjacent tree row, e.g. tree row 302, located in the second tree column, e.g. tree column 346, such that the trunk portion, e.g. trunk portion 222, and the second adjacent trunk portion, e.g. trunk portion 324, are offset from one another along first direction 110 by half a distance between the first tree column, e.g. tree column 348, and a third adjacent tree column, e.g. 340, in the tree row, e.g. tree row 202. It should be appreciated that half a distance between the first tree column, e.g. tree column 348, and a third adjacent tree column, e.g. 340, in the tree row, e.g. tree row 202, is 10F, the full distance between these tree columns in a common tree row being 20F, but that generally the full distance and the corresponding half distance may differ from 20F and 10F, respectively, depending on the memory design.

With reference to FIG. 3, the word-line group 150 comprising successive word lines 152, 156, 160, and 164 is shown. The successive word lines run in opposite directions; word lines 152 and 160 run along the same second direction towards the front side of the first array 301 of memory cells, e.g. along directions 154 and 162, respectively; and, word lines 156 and 164 run along the same second direction towards the back side of the first array 301 of memory cells, e.g. along directions 158 and 166, respectively. These word lines cross with the branch portions of the tree structures arranged in rows and tree columns at a plurality of first intersection regions, a plurality of memory cells being located at the first intersection regions in a layer disposed between the word lines and branch portions of the tree structures, as in a cross-point pattern as for a cross-point addressable memory, as is known in the art. For example, word-line group 150, comprising successive word lines 152, 156, 160, and 164, crosses with and overlaps the branch portion 322 of the tree structure 305, and the branch portion 116 of the tree structure 106 in respective tree rows 302 and 202. In particular, word line 152 crosses with and overlaps the branch portion 116 at a first intersection region where the memory cell 102 is located in a layer; the memory cell 102 comprises a PC-material layer (not shown) disposed between the word line 152 and the branch portion 116 of the tree structure 106 at a first intersection region. In an embodiment of the present invention, the memory cell 102 does not have an intervening current-steering element between the word line 152 and the branch portion 116 of the tree structure 106. A novel feature of an embodiment of the present invention is that the memory cell 102 does not require an intervening current-steering element, such as a diode or transistor, greatly simplifying the fabrication and operation of a memory device having such tree structures Embodiments of the present invention reduce the cost of a memory device having such tree structures because the fabrication and operation of such memory devices is greatly simplified.

In an embodiment of the present invention, as shown in FIG. 3, the word lines in the top layer are shown. However, it should be appreciated that word lines are stacked vertically in layers one above the other in a plurality of layers, as shown in FIG. 1. A word-line layer being disposed above or below a layer in which the branch portions of tree structures are lithographically patterned, successive layers of word lines being alternately disposed above and below a given branch portion of a tree structure. It should be appreciated that there are alternative arrangements for the disposition of word lines with respect to a branch portion which may be selected from the group of arrangements consisting of a word line above a branch portion, a word line below a branch portion, and combinations of arrangements of a word line above and a word line below a branch portion. In lithographically patterning the word lines and branch portions, the PC-material layer below a word line or branch portion may be patterned in the same patterning step to form a PC-material line, so that memory cells are connected by a PC-material line. Alternatively, the PC-material layer below a word line or branch portion may not be patterned in the same patterning step to form a PC-material line, so that memory cells are interconnected by a thin-film layer of PC material. On the other hand, the PC-material layer below a word line or branch portion may be patterned in a separate patterning step from that used to pattern the word lines and branch portions, so that the memory cell comprises a pillar of a phase-change material.

In an embodiment of the present invention, two layers of memory cells are disposed between a branch portion and two respective layers of word lines disposed one above, and one below, a branch portion. Thus, memory cells located in PC-material layers at first intersection regions are stacked vertically in tree columns along the third direction 111 located at the intersections of a word line and a branch portion of a tree structure. The tree columns of memory cells of a branch portion of a tree structure under adjacent word lines in a word-line group of a single word-line layer are offset from one another by a spacing of 2F along the first direction 110 substantially parallel to a branch portion, and by 2F along the second direction 154 substantially parallel to a word line. A novel feature of an embodiment of the present invention is the interleaving of branch portions of adjacent free columns, e.g. tree columns 340 and 342, as shown in FIG. 3. The interleaving of branch portions facilitates an improved bit-cell density, e.g. chip capacity, wherein the columns of memory cells are arranged on a 2F×2F spacing in word-line groups while trunk portions, e.g. trunk portions trunk portion 330, trunk portion 222, and 336, along a tree column, e.g. tree column 348, are spaced by 4F as shown in FIG. 3.

Further elaborating on embodiments of the present invention as described above, FIG. 3 illustrates the bit-cell density, e.g. chip capacity, of tree-structure memory devices based on embodiments of the present invention. Adjacent memory cells between tree trunks are arranged on a 2F×2F spacing; and since word lines are not shared, tree trunks are spaced in adjacent rows with a spacing of 2F along the second direction 154, while adjacent tree trunks in common columns are spaced with a spacing of 4F along the second direction 154. Also, adjacent word lines in a word-line group are spaced with a spacing of 2F along the first direction 110, while adjacent word lines that run in a same second direction, e.g. 154 or 158, in a word-line group are spaced with a spacing of 4F along the first direction 110. For example, 512 tree structures may be arranged in a tree column with 32 word lines electrically connected to memory cells within the tree column. Adjacent tree columns may have their branch portions interleave with those of a central column located therebetween, so that each word line connects to 1024 memory cells. The number of tree columns may be quite large such as 1024 tree columns, resulting in 512×1024×32=16 Mb per memory-cell array, e.g. first array 301 of memory cells. Also, as shown in FIG. 3, half of the word lines may be electrically connected to control circuits on one end of a column in a sub-array 310 of the second array, while the other half, to a sub-array 312 of the second array. This enables a 4F spacing along the first direction 110 in word line contacts with the second array of word-line-driver transistors. Alternatively, all word lines may be electrically connected to control circuits on one end of a column.

With further reference to FIG. 3 and a manner of interconnection of various units within a tree-structure memory device, each tree trunk is electrically connected to a tree-access transistor constructed on a silicon substrate. All tree-access transistors in a column of tree structures, e.g. tree column 340, may be turned on with a tree-column-select line, e.g. the tree-column-select line shown serving as gate 132, electrically connected to the respective gates of all tree-access transistors of the associated tree column, e.g. tree column 340. When these transistors are turned on, they connect every tree structure in the associated tree column to its tree-row line, e.g. a bit line. If there be 1024 of these tree-row lines, but only 512 tree structures in a tree column, as for the example discussed above, then tree-row lines only electrically connect with every other tree column. Furthermore, half, 512, of the tree-row lines electrically connect with control circuits at one end of the first array 301, the memory-cell array, in a sub-array 314 of a third array of circuits, and the other half, 512, electrically connect with control circuits at the other end of the first array 301, the memory-cell array, in a sub-array 316 of the third array. Also, each tree-row line connects to 512 tree structures. Since tree trunks, word-line contacts, tree-row line contacts have the 4F spacing along respective directions, relaxed ground rules may be used for these contacts, the tree-access transistors, and the control circuits in the second and third arrays. For example, bit lines, e.g. branch portions of a tree structure, word lines, and tree-row lines might be fabricated using 45 nm, or less, lithography, whereas tree trunks, array contacts, tree-access transistors, and control circuitry of the second and third arrays might be fabricated with 90 nm, or less, lithography. For embodiments of the present invention, the use of the less aggressive lithographic 90 nm, or less, ground rules for the latter would significantly lower fabrication costs of the tree-structure memory device.

With further reference to FIG. 3, memory cells are arranged in layers of threshold-type PC material disposed below a layer of word lines running above a layer of branch portions of tree structures, or below a layer of branch portions of tree structures disposed above a layer of word lines running under the branch portions. In an embodiment of the present invention, the layers of threshold-type PC material may be patterned as lines lying respectively under a layer of word lines running above a layer of branch portions of tree structures, or under a layer of branch portions of tree structures disposed above a layer of word lines. As a result of patterning the layer of threshold-type PC material with a common mask to define either the word lines, or branch portions of tree structures, economies in the manufacturing process can be realized that reduce the cost of production of the tree-structure memory device through the reduction in numbers of masks and associated process steps in device fabrication.

With further reference to FIG. 3, word lines running to the front side of the first array 301, the memory-cell array, are electrically connected to vertical riser portions at the back side of the first array 301, the memory-cell array, and lines running to the back side are electrically connected to vertical riser portions at the front side. For example, word lines 152 and 160 run to the front side of the first array 301, the memory-cell array, along respective second directions 154 and 162, but are electrically connected to vertical riser portions 352 and 360, respectively, at the back side. Similarly, word lines 156 and 164 run to the back side of the first array 301, the memory-cell array, along respective second directions 158 and 166, but are electrically connected to vertical riser portions 356 and 364, respectively, at the front side. Second neighboring word lines miming in a same second direction, e.g. 154 or 158, are spaced apart on a spacing of 4F along the first direction 110. The vertical riser portions 352 and 360 of the word lines 152 and 160 run down to the sub-array 310 of a second array of word-line-driver transistors along the third direction 111; the vertical riser portions 352 and 360 of the word lines 152 and 160 are electrically connected to the word-line-driver transistors in the sub-array 310. Similarly, the vertical riser portions 356 and 364 of the word lines 156 and 164 run down to the sub-array 312 of a second array of word-line-driver transistors along the third direction 111; the vertical riser portions 356 and 364 of the word lines 156 and 164 are electrically connected to the word-line-driver transistors in the sub-array 312. A cross-section down the center line 370 of word line 152 is useful for further discussion of the interconnection scheme of word lines with word-line-driver transistors in a representative sub-array 310 of the second array of word-line-driver transistors located at the back-side of the first array 301 of memory cells, which is discussed next in FIG. 4.

Figure 4:
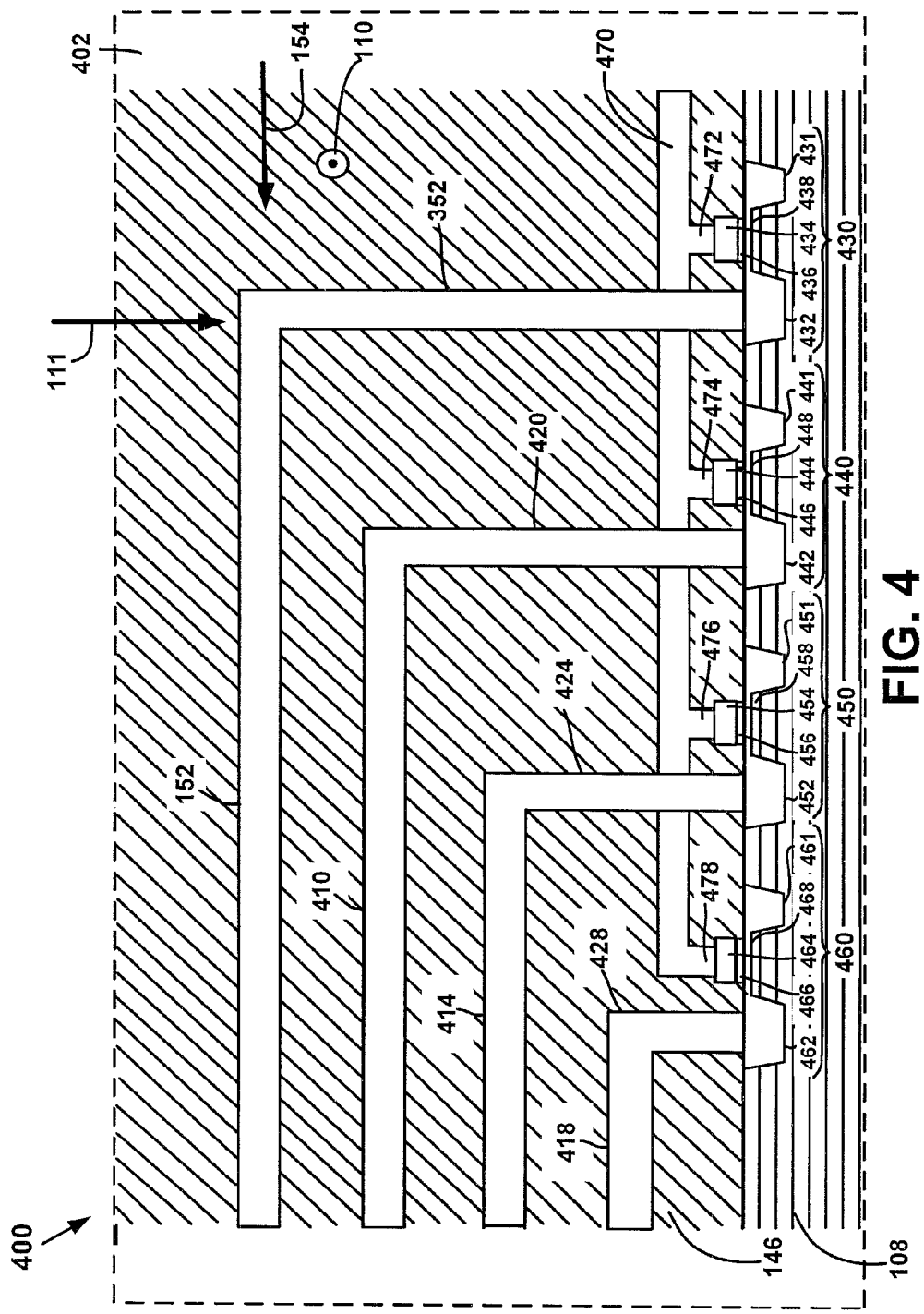
FIG. 4 is a cross-sectional view of a word-line driver structure of a threshold-type, PCM illustrating an embodiment of the present invention.

Turning now to FIG. 4 to illustrate an embodiment of the present invention 400 for electrically connecting word lines to word-line-driver transistors in the sub-array 310 at the back-side of the first array 301 of memory cells, a portion 402 of the cross-section down the center line 370 of the word line 152 is shown through a representative portion of the sub-array 310 containing four complete word-line-driver transistors 430, 440, 450 and 460. The cross-section, as shown, is substantially perpendicular to the substrate 108 upon which the threshold-type PCM device is fabricated as indicated by the third direction 111, substantially parallel to the second direction 154 of word line 152, and substantially perpendicular to the first direction 110 as indicated by the arrow head symbol. With reference to FIG. 4, for the embodiment of the present invention 400, word lines 152, 410, 414, and 418 are electrically connected to vertical riser portions 352, 420, 424, and 428 of the respective word lines. The vertical riser portions 352, 420, 424, and 428 are electrically connected to word-line-driver transistors 430, 440, 450, and 460, respectively. For an embodiment of the present invention in which the word-line-driver transistors 430, 440, 450, and 460 are FETs, the vertical riser portions 352, 420, 424, and 428 are electrically connected respectively to second source/drains 432, 442, 452, and 462 of the respective, word-line-driver transistors 430, 440, 450, and 460. The portions 432, 442, 452, and 462 of the word-line-driver transistors 430, 440, 450, and 460 to which the vertical riser portions 352, 420, 424, and 428 are electrically connected are designated as source/drains, because a current to the memory cells can flow either out of or into the word-line-driver transistors 430, 440, 450, and 460 for the memory cells to which respective word lines are connected.

With further reference to FIG. 4, the word-line-driver transistor 430 may be a FET, which includes a first source/drain 431, a gate 434, a channel 438, and a second source/drain 432 connected to the first source/drain 431 through the channel 438. In one embodiment of the present invention as shown, a word-line-select line 470 connects to the gate 434 of the FET through a vertical-riser portion 472 of the word-line-select line 470. It should be appreciated that word-line-select line 470 formed on the substrate 108 runs generally in a plane substantially parallel to the substrate surface and extending substantially in a second direction 154, but at the cross-over with the vertical riser portions 352, 420, 424, and 428 of respective word lines 152, 410, 414, and 418 is offset below the plane of the FIG. to avoid interference with the vertical riser portions 352, 420, 424, and 428. The FET is fabricated with standard techniques known from the art of IC fabrication. The FET may include a gate dielectric 436 (as shown), as for an IGFET; or, it may not include the gate dielectric 436 as for a JFET. In one embodiment of the present invention, the substrate 108 comprises silicon (Si), and the gate dielectric 436 may comprise $SiO_2$, as for a MOSFET. Similarly, word-line-driver transistors 440, 450, and 460 may be FETs, which include respective first source/drains 441, 451, and 461, respective gates 444, 454, and 464, respective channels 448, 458, and 468, and respective second source/drains 442, 452, and 462, connected to the respective first source/drains 441, 451, and 461 through the respective channels 448, 458, and 468, as shown in FIG. 4. The respective gates 444, 454, and 464 of the word-line-driver transistors 440, 450, and 460 are connected to the word-line-select line 470 through respective vertical-riser portions 474, 476 and 478 of the word-line-select line 470. Moreover, the FETs may include respective gate dielectrics 446, 456, and 466; in one embodiment of the present invention, the substrate 108 may be silicon, and the respective gate dielectrics 446, 456, and 466 may comprise $SiO_2$, as for MOSFETs.

With reference once again to FIG. 3, the sub-array 312 at the front-side of the first array 301 of memory cells may comprise a similar arrangement of word-line-driver transistors as shown in FIG. 4, as for a portion of a cross-section (not shown) down the center line of the word line 156. Similarly, a third array of sense-amplifier circuits may be disposed in two sub-arrays 314 and 316 one to the left and one to the right, respectively, of the first array 301 of memory cells. A sense-amplifier circuit of the third array is electrically connected to a tree-row line, e.g. bit line 112, providing access to a row of tree structures, e.g. tree row 202. The sense-amplifier circuit provides functionality for both determining and outputting the data state of a memory cell of a tree structure, e.g. tree structure 106, accessed by a tree-access transistor. To facilitate a high bit density of memory cells in the first array 301, the memory-cell array, a plurality of the tree-row lines, e.g. bit lines, run alternatingly from the sub-array 314 on the left of the memory-cell array, e.g. first array 301, and then from the sub-array 316 on the right of the memory-cell array, e.g. first array 301, in an interleaved arrangement (not shown). However, the bit lines can not run in a straight line along, or alternatively opposite to, direction 110, because the tree trunks of tree structures, due to their tight spacing, would likely interfere with such a routing of the bit lines. Rather, as is known in the art, the bit lines may snake their way through the tree structures in a serpentine pattern at two separate levels, e.g. planes, above and substantially parallel to the substrate surface to avoid interference with the tree structures, as well as with one another. This arrangement of bit lines allows for the 2F×2F spacing per memory cell of adjacent memory cells of a common word-line group and a correspondingly high bit-cell density in the first array 301 of memory cells.

With further reference to FIG. 3, in another embodiment of the present invention, a plurality of tree-column-select lines are electrically connected to a plurality of tree-column-select transistors in a fourth array. The tree-column-select transistors comprise two sub-arrays 380 and 382 one located at the back side and one located at the front side, respectively, of the first array 301 of memory cells. To facilitate a high bit-cell density of memory cells in the first array 301, the tree-column-select lines run alternatingly from the sub-array 380, and then from the sub-array 382 in an interleaved pattern. However, because the tree-column-select lines run alternatively substantially parallel to second directions 154 and 158 and substantially perpendicular to the first direction 110, and are offset from the vias for the tree structures, the routing of the tree-column-select lines poses no interference problem with the tree structures. Rather, routing may become an issue where the tree-column-select lines cross the second array of word-line-driver transistors in sub-arrays 310 and 312, because of potential interference with the vertical riser portions of the word-lines connecting to the word-line-driver transistors. However, this may be remedied by rerouting the tree-column-select lines around the vertical riser portions of the word-lines as is known in the art. Alternatively, tree-column-select lines are not interleaved and their driver transistors are arranged on the same side of the memory-cell array, e.g. first array 301.

Figure 5A:
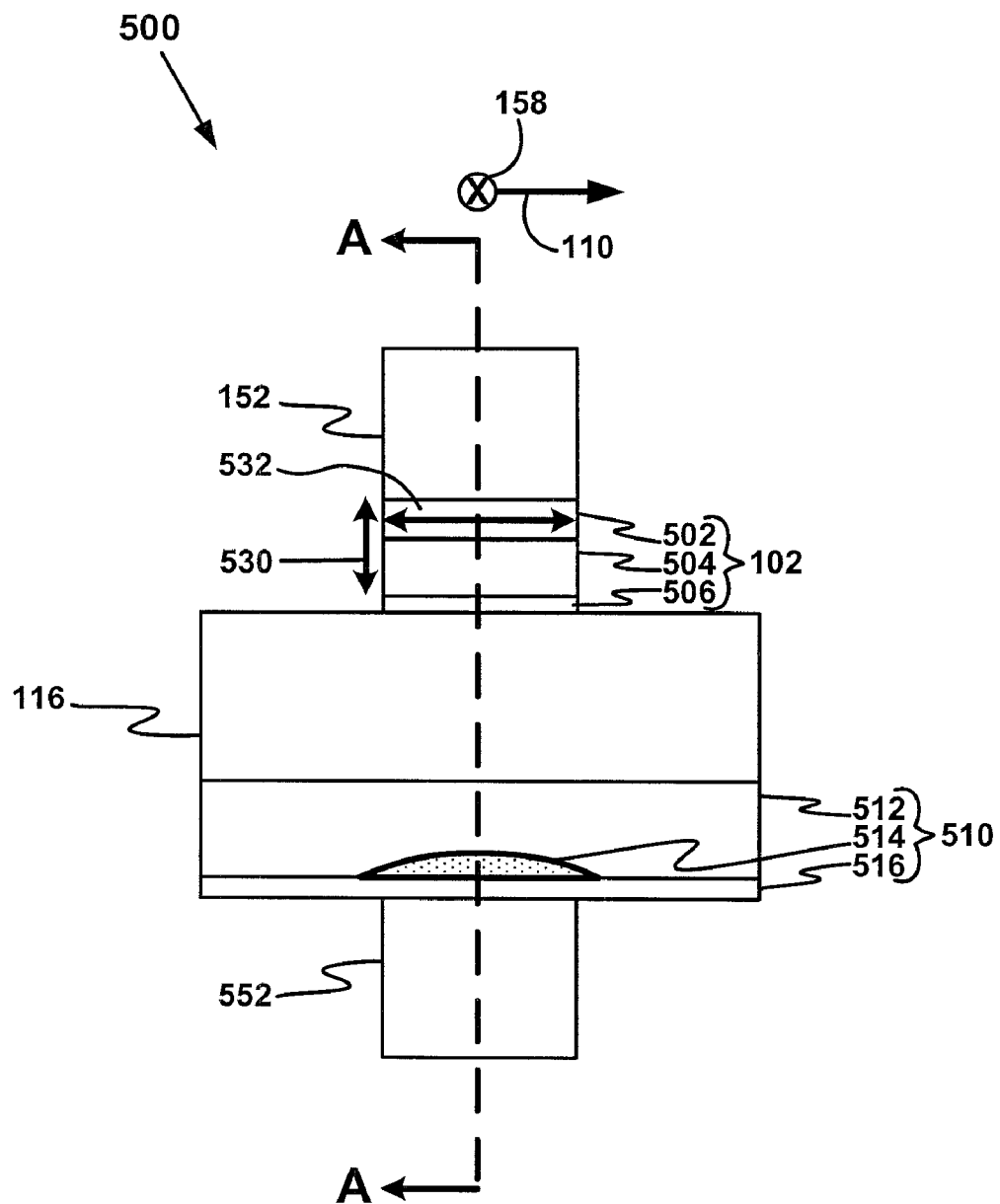
FIGS. 5A and 5B illustrate embodiments of the present invention in a cross-sectional view of threshold-type, PCM cells in two physical states corresponding to two programmed data states.
Figure 5B:
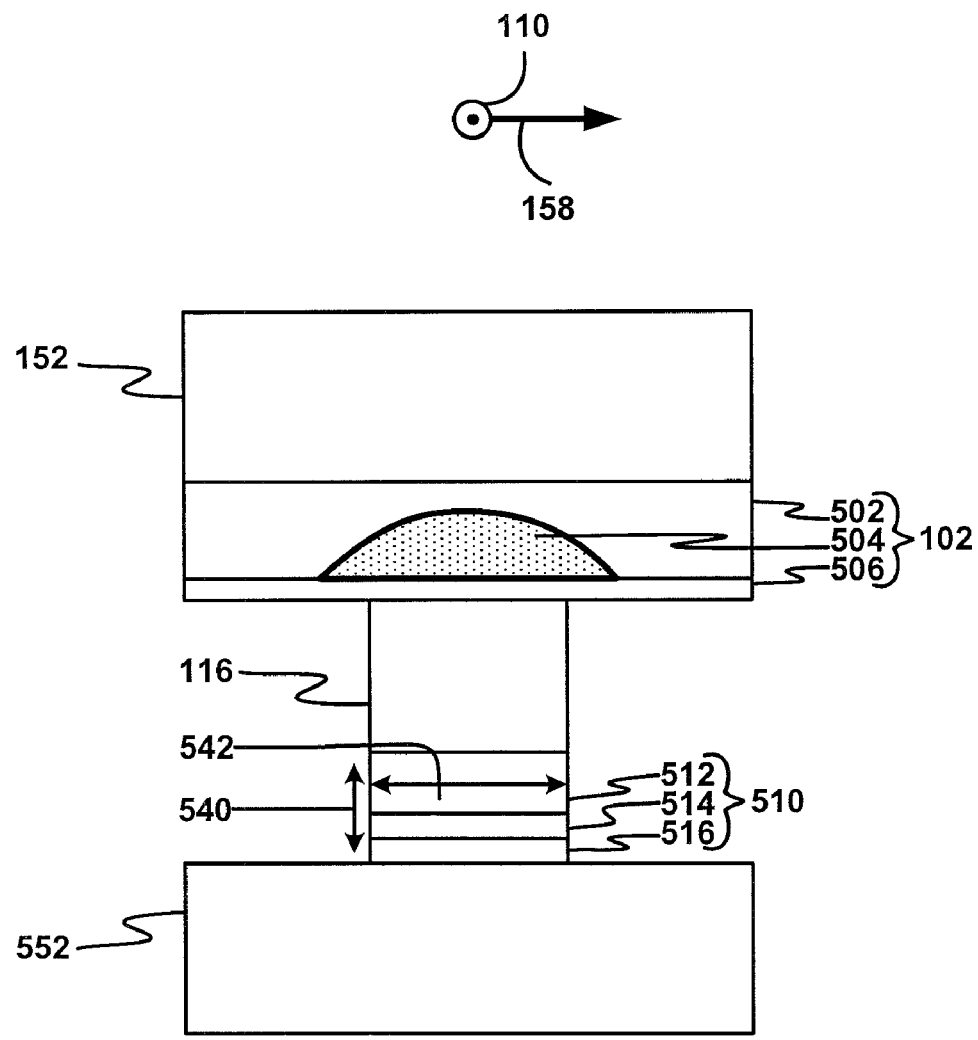

Description of Embodiments of the Present Invention for the Operation of Storing Data States in a Memory Cell In accordance with an embodiment of the present invention 500, FIGS. 5A and 5B show the disposition of a PC-material layer in memory cells 102 and 510, and show an enlarged view of memory cells 102 and 510 in two physical states; the two physical states correspond to two data states corresponding to two different resistance states when memory cells 102 and 510 are read. FIG. 5A shows an enlarged view of memory cells 102 and 510 as for the cross-section of FIG. 1 as viewed down the second direction 158 along the word line 152 running from the back side towards the front side of the memory-cell array, e.g. first array 301. FIG. 5B shows memory cells 102 and 510 cross-sectioned along line AA as viewed facing the first direction 110 along the branch portion 116 of the tree structure 106.

With further reference to FIGS. 5A and 5B, in accordance with the embodiment of the present invention 500, the memory cell 102 is shown comprising an amorphous threshold-type, PC-material portion 504, and a crystalline, PC-material portion 502. The memory cell 102 may further comprise a TIB layer 506 adjacent to the threshold-type, PC-material portion 504 of the PC-material layer of the memory cell 102, here shown as an underlayer of the PC-material layer comprising the amorphous threshold-type, PC-material portion 504 and the crystalline, PC-material portion 502; it should be recognized that the arrangement shown does not preclude embodiments of the present invention for which the TIB layer is disposed above a threshold-type, PC-material portion of the PC-material layer (not shown). The memory cell 102 comprising the PC-material layer is disposed between the word line 152 and the branch portion 116 of the tree structure 106 at a first intersection region; no intervening current-steering element is necessary for the operation of this threshold-type, PCM cell, because the memory cell 102 is provided with the amorphous threshold-type, PC-material portion 504 that exhibits ovonic-threshold-switching behavior. The intersection region may be an approximately square or rectangular area with a width 532, e.g. about equal to or less than 180 nm, and a length 542, e.g. about equal to or less than 180 nm; and, the total thickness 530 of the PC-material layer, comprising both the amorphous threshold-type, PC-material portion 504 and the crystalline, PC-material portion 502, may be in the range of 10 nm to 50 nm. It should be appreciated that scaling of the memory cells to smaller dimensions is highly desirable for increasing the storage capacity of threshold-type PCMs using such memory cells; thus, the lower bounds of the length and width dimensions of memory cells 102 and 510, which are limited primarily by improvements in lithographic technology for producing features of small dimension, are within the spirit and scope of embodiments of the present invention.

In accordance with the embodiment of the present invention 500, it is possible to control the effective thickness of the amorphous threshold-type, PC-material portion 504 within the crystalline, PC-material portion 502. For example, if more power is applied during a reset pulse, e.g. write pulse, a melted volume results in an amorphous threshold-type, PC-material portion 504 that is larger, after quenching the melted volume by loss of heat to surrounding material. As shown in FIG. 5B, the shape of the amorphous threshold-type, PC-material portion 504 is that of a rounded layer; the effective thickness of this rounded layer of amorphous threshold-type PC material is primarily responsible for the resistance state of the memory cell 102. Reset pulses, e.g. write pulses, having a high power create an amorphous threshold-type, PC-material portion 504 that is thicker than for reset pulses, e.g. write pulses, having a lower power. As shown in FIG. 5A, the amorphous threshold-type, PC-material portion 504 is a fairly thick layer occupying more than half the space between the branch portion 116 and word line 152 in the plane of the cross-section of FIG. 5A. Thus, the physical state of memory cell 102 would correspond to a high resistance state of memory cell 102 when read, and a corresponding "0" bit, data state.

With further reference to FIGS. 5A and 5B, in accordance with the embodiment of the present invention 500, a memory cell 510 is shown comprising an amorphous threshold-type, PC-material portion 514, and a crystalline, PC-material portion 512. The memory cell 510 may further comprise a TIB layer 516 adjacent to the threshold-type, PC-material portion 514 of the PC-material layer of the memory cell 510. The memory cell 510 comprising the PC-material layer is disposed between a word line 552 and the branch portion 116 of the tree structure 106 at the first intersection region for an embodiment of the present invention where word line 152 is disposed above word line 552 as shown. Thus, it should be appreciated that the tree-structure memory device may comprise a plurality of memory cells including a lower memory cell, e.g. memory cell 510, disposed below the branch portion, e.g. branch portion 116, at the first intersection region and an upper memory cell, e.g. memory cell 102, disposed above the branch portion, e.g. branch portion 116, at the first intersection region. The intersection region may be an approximately square or rectangular area with dimensions nominally the same as those of the memory cell 102 described above. As shown in FIG. 5A, the shape of the amorphous threshold-type, PC-material portion 504 is that of a rounded layer; the effective thickness of this rounded layer of amorphous threshold-type PC material is primarily responsible for the resistance state of the memory cell 102. The effect of a reset pulse, e.g. write pulse, having lower power than that used to reset the memory cell 102 is seen on comparison of the memory cell 102 to the memory cell 510. As shown in FIG. 5B, the amorphous threshold-type, PC-material portion 514 of the memory cell 510 is thinner than the amorphous threshold-type, PC-material portion 504 of the memory cell 102 occupying about one quarter the space between the branch portion 116 and word line 552 in the plane of the cross-section of FIG. 5B. Thus, in the case of the memory cell 510, less power is applied during a reset pulse, e.g. write pulse, used to create a melted volume resulting in the amorphous threshold-type, PC-material portion 514 than in the case of the memory cell 102. Thus, the physical state of the memory cell 510 would correspond to a lower resistance state of the memory cell 510 when read than the resistance state of the memory cell 102, and would correspond to a "1" bit, data state.

With further reference to FIGS. 5A and 5B, it should be appreciated that only the amorphous portion of a PC-material layer exhibits ovonic-threshold-switching behavior providing the data storage function of a memory cell. Moreover, it should be appreciated that upon fabrication the PC-material layer may be entirely crystalline without any amorphous portions requiring initialization to program a memory cell with an amorphous portion. Thus, although memory cells 102 and 510 are shown in FIGS. 5A and 5B as including amorphous threshold-type, PC-material portions 504 and 514, a PCM prior to initialization with an entirely crystalline PC-material layer is within the scope and spirit of embodiments of the present invention.

For the embodiments of the present invention shown in FIGS. 5A and 5B, it should be recognized, that it is possible to avoid the use of an intervening current-steering element, such as a transistor or diode, to store information, as data states, e.g. bit states, in the memory cells 102 and 510 by using an operating principle based upon "ovonic-threshold switching," a term of art. For example, if more power is applied during the reset pulse, e.g. write pulse, the melted volume is larger and the resulting amorphous threshold-type, PC-material portion is larger after quenching. Therefore, it is possible to control the thickness of the amorphous threshold-type, PC-material portion within a PC-material layer. When in the amorphous phase, threshold-type PC material, such as semiconducting GST, exhibits a very high resistance. However, at a threshold voltage on the order of about 1 to 1.5 volts, a large current will suddenly begin to flow, and this threshold voltage depends on the thickness of the amorphous material. For example, the memory cell 510 with the amorphous threshold-type, PC-material portion 514, which is thin, may have a threshold voltage of 1 volt, and the memory cell 102 with the amorphous threshold-type, PC-material portion 504, which is thick, may have a threshold voltage of 1.5 volts, greater than that of the memory cell 510. For an applied voltage of 1.25 volts, typically used in reading a memory cell, a large read current will flow through the memory cell 510, because the memory cell 510 has previously been programmed with the amorphous threshold-type, PC-material portion 514, which is thin, and 1.25 volts is above the 1 volt threshold of the memory cell 510. However, for the same applied voltage of 1.25 volts, very little read current will flow will flow through the memory cell 102, because the memory cell 102 has previously been programmed with the amorphous threshold-type, PC-material portion 504, which is thick, and 1.25 volts is below the 1.5 volt threshold of the memory cell 102. The ratio of the currents drawn by memory cells 102 and 510 programmed in these two different data states can be 100 times or more. It is important that during reading, voltage pulses of short pulse-duration time are used to avoid heating and changing the state of the threshold-type PCM. Alternatively, one may use a series resistor during the read operation to limit the read current flow above threshold and avoid heating although this will result in a smaller read margin. This approach may be generalized for multi-bit-per-cell operation. For example, a memory cell may be programmed with four different threshold voltages to store 2 bits-per-cell.

It should also be appreciated that the threshold voltage corresponds to a sudden very large increase in current flow due to a reversible electronic effect when a high enough voltage is applied across an amorphous threshold-type, PC-material portion comprising GST, or other threshold-type PC material, such as a chalcogenide exhibiting ovonic-threshold-switching behavior when in the amorphous state. This threshold effect, known as ovonic-threshold switching, is an electronic effect and not related to the phase change of the PC material. A very non-linear current/voltage (I/V) curve in the amorphous state makes it possible to avoid using a separate, intervening current-steering element, such as a transistor or diode, in the memory cell. For threshold-type PCM, the cell data is encoded in the threshold voltage. For every memory value, the memory cell always has an amorphous threshold-type, PC-material portion through which the current must travel, because the threshold effect, ovonic-threshold switching, only happens in the amorphous phase. When storing data in a threshold-type PCM cell, the memory cell always contains an amorphous region through which current can pass.

With further reference to FIGS. 5A and 5B, in accordance with the embodiment of the present invention 500, the memory cells 102 and 510 also comprise TIB layers 506 and 516, respectively. The TIB layers 506 and 516 may comprise as a very thin layer of $Ta_2O_5$, or other thermally insulating material which also has sufficient electrical conductance to pass an electrical current though the memory cells 102 and 510. TIB layers 506 and 516 facilitate the transformation of portions of the PC-material layer from a crystalline state to an amorphous state, and vice versa.

Figure 6:
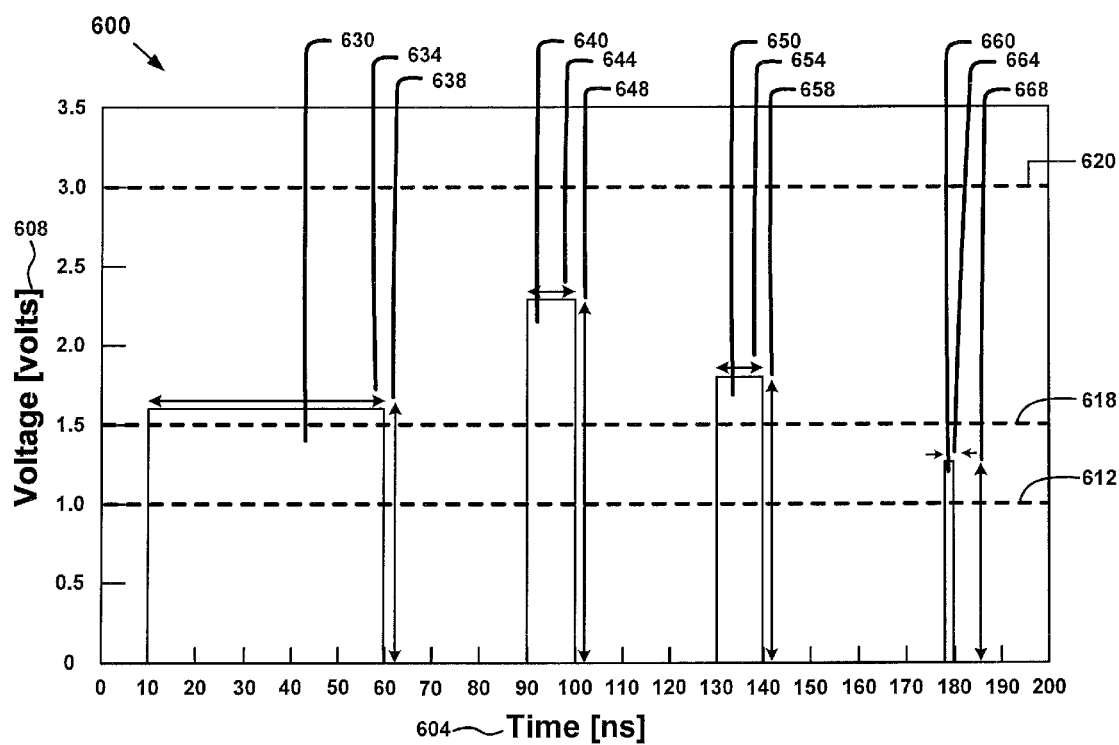
FIG. 6 is a graph illustrating the various voltage pulses used to transform the physical state of a threshold-type, PCM cell illustrating an embodiment of the present invention.

With reference now to FIG. 6, in accordance with an embodiment of the present invention 600, the mechanisms by which the memory cell 102 transforms from one data state to another are next described. The essence of a PC material, exhibiting ovonic-threshold-switching behavior when in the amorphous state, is that the thickness of an amorphous threshold-type, PC-material layer depends on the amount of PC material that transforms from the crystalline state to the amorphous state to effect a change in the data state of a memory cell. To change the data state of a memory cell, a voltage pulse is applied which has a certain pulse amplitude, and lasts for a certain pulse-duration time. FIG. 6 shows voltage pulses 630, 640 and 650 of different pulse amplitudes 638, 648 and 658, and of different pulse-duration times 634, 644 and 654, respectively, suitable for transforming the physical state of a PC-material layer, which corresponds to an erase event, and writing events, respectively, in the memory cell 102 or the memory cell 510. The voltage pulses are plotted on a graph with the ordinate, voltage 608, and the abscissa, time 604; the pulse amplitudes are measured relative to the ordinate, voltage 608, in units of volts; and, the pulse-duration time is measured relative to the abscissa, time 604, in units of nanoseconds (ns). Voltage pulse 630 is suitable for erasing a programmed data state of the memory cell 102 or the memory cell 510 initially in a data state programmed by write pulses, e.g. voltage pulses 640 and 650, known in the art as reset pulses. It should be appreciated that pulse 630 may not be needed, and is optional or useful if the cell is still in the amorphous state after fabrication.

With further reference to FIG. 6, in accordance with the embodiment of the present invention 600, upon deposition the PC-material layer may start off in an initially amorphous state; similarly, after the memory cell 102 or the memory cell 510 have been programmed with write pulses, the memory cells 102 and 510 will have a certain amount of amorphous threshold-type PC material present, e.g. the amorphous threshold-type, PC-material portion 504 and the amorphous threshold-type, PC-material portion 514, respectively. It will be appreciated that it may be desirable to erase a memory cell and return it to a consistent starting state from which it may be programmed. To return the memory cell to a consistent starting state, an erase pulse, e.g. voltage pulse 630, may be applied to the memory cell initially in a physical state having an amorphous threshold-type, PC-material portion present. An erase pulse, e.g. voltage pulse 630, should be sufficient to create enough Joule heating and have sufficient duration to allow the nucleation and growth of a crystalline phase of the GST for a fully amorphous threshold-type, PC-material layer which may be in an amorphous state after device fabrication. The voltage must be high enough to be above threshold to ensure that sufficient current flows. For GST, the crystallization temperature is about 400 C. Since Joule heating is based on $I^2R$, or $V^2/R$, where I is the current passed through, V is the voltage applied across, and R is the resistance of the threshold-type, PC-material layer, the amount of power delivered by the erase pulse, e.g. voltage pulse 630, should supply sufficient thermal energy to raise the temperature of amorphous threshold-type, PC-material layer to 400 C long enough for the layer to crystallize. For example, for the memory cells 102 and 510 with width 532 and length 542, of 180 nm, and thickness 10 nm to 50 nm, the pulse-duration time 634 of erase pulse, e.g. voltage pulse 630, should be about 50 ns to crystallize a fully amorphous threshold-type, PC-material portion of a PC-material layer comprising GST; and, the pulse amplitude 638 of erase pulse, e.g. voltage pulse 630, should be moderately high, e.g. about 1.6 volts or higher, to create enough Joule heating to allow crystallization of a fully amorphous threshold-type, PC-material layer such as GST. In other words, the erase pulse, e.g. voltage pulse 630, should have sufficient power to crystallize whatever amount of amorphous threshold-type PC material may be present in the memory cell. It may also be useful to turn off the pulse slowly to ensure that a melted region (if any) has enough time to crystallize after solidification. Although useful to initially crystallize a cell after device fabrication, this may not be needed if the cells are fully crystallized during fabrication, for example, by wafer heating. Furthermore, pulse 630 may not be necessary to change the data state of the cell. For this purpose pulses 640 or 650 may alone be sufficient.

With further reference to FIG. 6 in conjunction with FIGS. 5A and 5B, the physical mechanism of writing a memory cell for an embodiment of the present invention is described. FIG. 5A shows the memory cell 102 with the amorphous threshold-type, PC-material portion 504 associated with a high-resistance state of the memory cell 102 upon reading. For programming or writing a "0" bit, data state to the memory cell 102, a write pulse, e.g. voltage pulse 640, with a high enough pulse amplitude 648 and sufficiently long, pulse-duration time 644 is applied to the memory cell 102 in an initially crystalline state, erase state, so that a high enough current is passed through the PC-material layer sufficient to melt a thick portion of the PC-material layer, which upon quenching becomes the amorphous threshold-type, PC-material portion 504. For the physical dimensions of the memory cell 102 stated above, the pulse amplitude 648 is about 2.25 volts to write memory cell 102 with the amorphous threshold-type, PC-material portion 504, which is thick. The pulse-duration time 644 should be long enough to allow for the melting of the PC-material layer, or about 10 ns or less, as shown in FIG. 6. As is known in the art, the TIB layer 506 can be used to reduce the pulse amplitude for resetting memory cells to as low as about 1.5 volts from the 3.0 volts required in the absence of the TIB layer 506; and, currents are correspondingly reduced from about 1 mA to about 100 μA, or about a factor of ten less current, for devices having a nominal 180 nm×180 nm device size (areal footprint).

With further reference to FIG. 6 in conjunction with FIGS. 5A and 5B, the physical mechanism of writing a memory cell for an embodiment of the present invention is further described. FIG. 5A shows the memory cell 510 with an amorphous threshold-type, PC-material portion 514 associated with a low-resistance state of the memory cell 510 upon reading. For programming or writing a "1" bit, data state to the memory cell 510, a write pulse, e.g. voltage pulse 650, with a high enough pulse amplitude 658 and sufficiently long, pulse-duration time 654 is applied to the memory cell 510 in an initially crystalline state, erase state, so that a high enough current is passed through the PC-material layer sufficient to melt a thin portion of the PC-material layer, which upon quenching becomes the amorphous threshold-type, PC-material portion 514, which is thin. For the physical dimensions of the memory cell 510 stated above, the pulse amplitude 658 is about 1.75 volts to write the memory cell 510 with the amorphous threshold-type, PC-material portion 514, which is thin. The pulse-duration time 654 should be long enough to allow for the melting of the PC-material layer, or about 10 ns or less, as shown in FIG. 6. In this case, if an erase pulse has not previously been used, sufficient time to crystallize a portion of the PC layer will be needed and the pulse should be about 50 ns long.

In accordance with an embodiment of the present invention, it should be appreciated that the tree-structure memory device may comprise a plurality of memory cells including a first memory cell, e.g. memory cell 102, with a first threshold voltage and a second memory cell, e.g. memory cell 510, with a second threshold voltage, wherein the first and the second threshold voltages are selected from a group consisting of a high threshold voltage corresponding to a "0" bit, data state, for example, as for memory cell 102, and a low threshold voltage corresponding to a "1" bit, data state, for example, as for memory cell 510.

In accordance with an embodiment of the present invention, the writing of a high-resistance or low-resistance state to memory cells 102 and 510, respectively, is called "resetting" the memory cell, to use a term known in the art. Corresponding to the resetting of the memory cells 102 and 510 are high and low threshold voltages, respectively. Thus, due to the ovonic-threshold-switching mechanism, the memory cell 102 with the amorphous threshold-type, PC-material portion 504, which is thick, will have a higher threshold voltage, so that ovonic-threshold switching is not triggered until a higher voltage is applied to the memory cell 102. Likewise, the memory cell 510 with the amorphous threshold-type, PC-material portion 514, which is thin, will have a lower threshold voltage because, being thinner, so that ovonic-threshold switching is triggered at a lower voltage that may be applied to memory cell 510. Thus, for the memory cell 510, a threshold voltage 612 for ovonic-threshold switching from its high resistance to low resistance state is 1.0 volt, the level of the threshold voltage 612 shown; and, for the memory cell 102, a threshold voltage 618 for ovonic-threshold switching from its high resistance to low resistance state is 1.5 volt, the level of the threshold voltage 618 shown.

In accordance with an embodiment of the present invention and with reference to FIG. 6, a read pulse, e.g. voltage pulse 660, suitable for reading the data state of memory cells 102 and 510 is shown. The read pulse, e.g. voltage pulse 660, has a pulse amplitude 668 and a pulse-duration time 664 suitable for reading the data state of a memory cell without appreciably altering the physical state of the memory cell. The read pulse, e.g. voltage pulse 660, unlike the write pulses, e.g. voltage pulses 640 and 650, discussed above, should be such as to leave the physical state and associated threshold voltage of the memory cell, and thus the data state stored within it, essentially unaltered. In an embodiment of the present invention, the read pulse, e.g. voltage pulse 660, has the pulse-duration time 664 of 10 ns or less, and has a pulse amplitude 668 of 1.25 volts that is greater than the threshold voltage 612 of 1.0 volts of the memory cell 510, and less than the threshold voltage 618 of 1.5 volts of the memory cell 102. It should be appreciated that a series resistor may be used during the read pulse to limit the read current flow further protecting the memory cell from any alteration of its physical state that might possibly occur in reading its data state.

It should be appreciated that ancillary circuitry will be required that is interfaced to the second, third, and fourth arrays described above to program the word-line-driver transistors, the sense-amplifier circuits, and the tree-column-select transistors, respectively, to deliver the voltage pulses described above to memory cells in the first array 301, e.g. memory-cell array. Various methods by which such voltage pulses are actually delivered to a memory cell are within the scope of embodiments of the present invention, which are next described.

Figure 7:
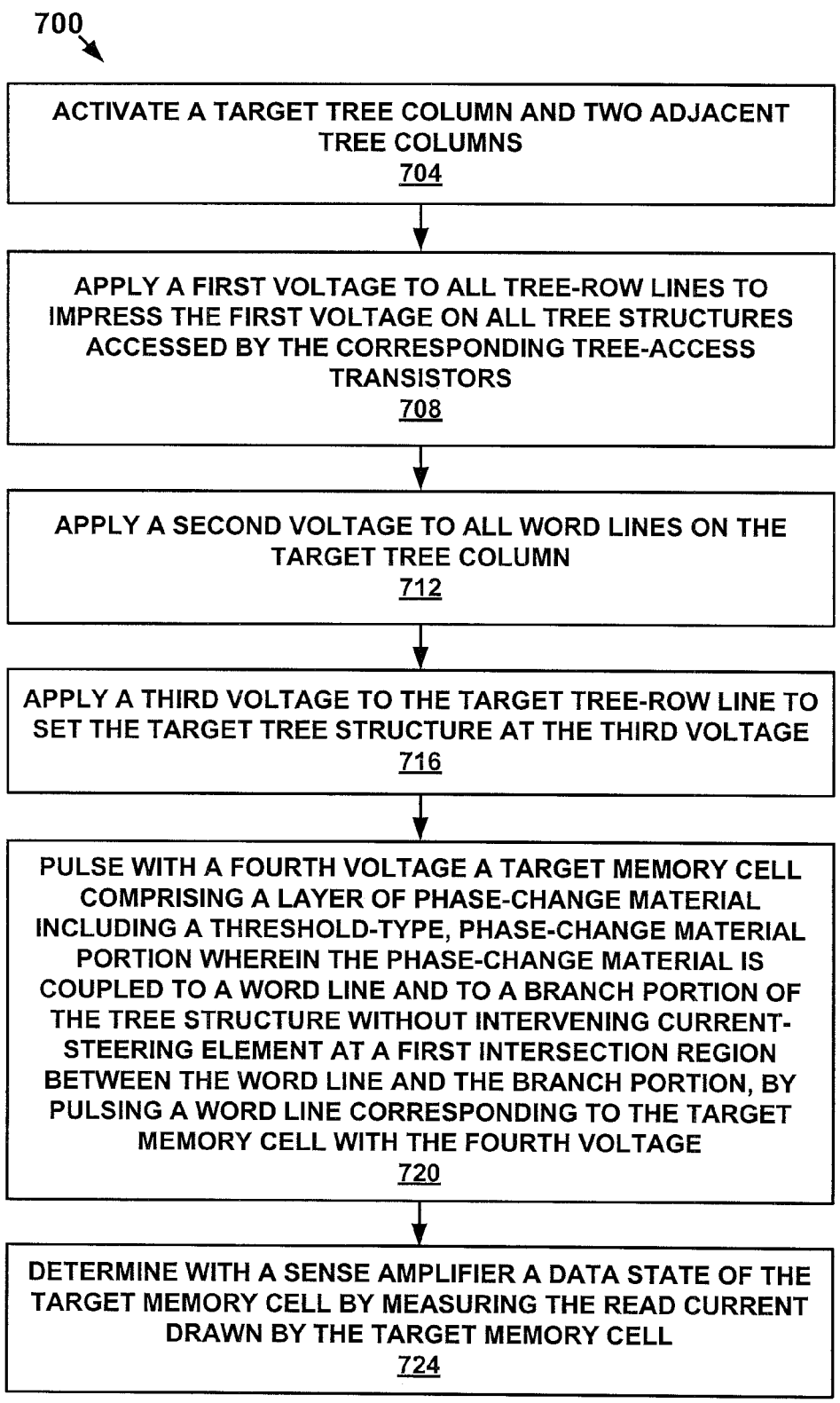
FIG. 7 is flow chart illustrating an embodiment of the present invention for reading a data state from a threshold-type, PCM cell.

Description of Embodiments of the Present Invention for a Method of Reading Data States Stored in a Threshold-Type PCM Cell With reference to FIG. 7, in accordance with an embodiment of the present invention 700, a method for reading the memory cell 102 of FIG. 1 is next described. To read the memory cell 102, a target tree column, e.g. tree column 340 (shown in FIG. 3), and two adjacent tree columns, e.g. tree columns 346 and 342, are activated 704. The tree columns 340, 342 and 346 are activated by bringing the corresponding three tree-column-select lines, e.g. 134 and 236 (shown in FIG. 2), and the tree-column-select line, shown serving as gate 132, high to turn on the corresponding tree access transistor 124. For the example 16 Mb memory discussed above, 1536 tree access transistors would be activated in the tree columns 340, 342 and 346. A first voltage may be applied 708 to all tree-row lines to impress the first voltage on all tree structures accessed by the corresponding tree-access transistors; the first voltage may have a value of 2V/3, where V is the full voltage to be applied across the memory cell 102 being read. With reference to FIG. 3, tree structures that have been impressed with a first voltage 2V/3 appear with vertical striations. Thus, 2V/3 is impressed on the tree structure 106, connected to the tree-access transistor 124 that contains the memory cell 102 being read; and, for the example 16 Mb memory, this results in 2V/3 being impressed on all 1536 trees connected to the 1536 tree-access transistors. Half of the tree-row lines are used to supply voltage to the 1024 outer trees in tree columns 342 and 346 adjacent to the tree column 340 containing the tree structure 106 having the memory cell 102 being read, while the other half are used to supply voltage to the central 512 trees. Because all other trees and all word lines in the memory-cell array, e.g. first array 301, are not connected, they "float" to 2V/3 due to the leakage currents between interleaving tree structures. Hence, if the memory-cell array, e.g. first array 301, is not already at 2V/3, applying this voltage to the 1536 tree structures will bring it up to 2V/3. However, the desired potential 2V/3 may already be present on the memory-cell array, e.g. first array 301, ahead of time to avoid this step for fast reading and writing.

With further reference to FIG. 7, a second voltage is applied 712 to all word lines on the target tree column, e.g. tree column 340, containing the tree structure 106 with the memory cell 102 to be read; the second voltage may have a value of V/3. With reference to FIG. 3, word lines with an applied second voltage of V/3 appear with diagonal striations, e.g. word lines 156, 160 and 164. For the case of the memory design shown in FIG. 1, all 32 word lines running to the tree structure 106 are brought to this second voltage. After applying the first and second voltages as described above, a third voltage is applied 716 to a target tree-row line, e.g. bit line 112 (shown in FIG. 2), to set the tree structure 106 with the memory cell 102 to be read at the third voltage; the third voltage may have a value of 0 V. With reference to FIG. 3, target tree structure, e.g. tree structure 106, having an applied third voltage of 0 V appears with dark cross-hatching. To apply this third voltage to the target tree-row line, e.g. bit line 112, a virtual ground sense-amplifier circuit, located in the sub-array 316 of the third array, may be used that is electrically connected to the end of the tree-row line, e.g. bit line 112. Next, the memory cell 102 to be read is pulsed 720 with a fourth voltage by applying the fourth voltage to the target word line 152 to which the memory cell 102 to be read is electrically connected; the fourth voltage may have a value of V, and the pulse-duration time may have a value less than about 100 ns. It should be appreciated that the pulse-duration time of the read pulse during the read operation depends on a variety of factors: avoiding alteration of the physical state of the memory cell through crystallization of amorphous material in the memory cell, which requires short pulses, less than about 10 ns; the presence and use of a read-current limiting resistor during the read operation, which allows the use of long pulses up to 100 ns; the effects of the TIB layer on the read time, which requires shorter pulses due to more efficient heating of the PC-material; and, the speed of the read electronics, which affects how short a pulse can be used.

With reference to FIG. 3, word line 152 having been raised to an applied fourth voltage V appears with a checker-board pattern. In an embodiment of the present invention, the memory cell 102 comprises a layer of PC material including an threshold-type, PC material portion wherein the PC material is coupled to the word line 152 and to the branch portion 116 of the tree structure 106 without an intervening current-steering element at a first intersection region between the word line 152 and the branch portion 116. The preceding operation should bring the full voltage V across the memory cell 102 to be read, located where word line 152 with the checker-board pattern crosses the branch portion 116 with the dark cross-hatching (as shown in FIG. 3), while other memory cells have at most V/3 applied across them. Last, the data state of the memory cell 102 is determined 724 by measuring the read current drawn by the memory cell 102 with the sense amplifier that is electrically connected to the end of the tree-row line, e.g. bit line 112, and located in the sub-array 316 of the third array. It should be appreciated that the sense-amplifier circuit may be interrogated with other circuitry to output the data state determined for memory cell 102. It should also be appreciated that, during reading, the read current to the memory cell 102 may be limited by a resistor placed in series with the memory cell 102; the resistor is disposed in series with the memory cell 102 by a circuit arrangement selected from a group consisting of a resistor disposed in series with the word line 152 by first switching transistors during reading of the memory cell 102 and a resistor disposed in series with the bit line 112 connected in series with said branch portion 116 by second switching transistors during reading of the memory cell 102.

In accordance with an embodiment of the present invention, the value of voltage V is between an upper threshold voltage and a lower threshold voltage, which in the case an embodiment of the present invention using just two data bit states would be associated with a "0" bit, data state and a "1" bit, data state stored in memory cells. For example, the value of V might be 1.25 volts. On the other hand, in the case of an embodiment of the present invention using more than two data bit states, the value of voltage V between an upper threshold voltage and a lower threshold voltage would be respectively between threshold voltages associated with a highest threshold voltage and a lowest threshold voltage for a plurality of data bit states greater than two stored in memory cells. If the memory cell 102 has the amorphous threshold-type, PC-material portion 504, which is thick, with a corresponding threshold voltage of 1.5 volts, little read current will flow through the cell, about 1 μA. However, if the memory cell 102 has the amorphous threshold-type, PC-material portion 514, which is thin, with a corresponding threshold voltage of 1.0 volts, a large read current will flow, about 100 µA. It should be appreciated that the currents and voltages given here are only examples. The currents are about right for an 180 nm device but should be smaller for smaller scaled devices. The other 31 memory cells in the tree structure 106 with the memory cell 102 will have a voltage of about 0.42 volts and will pass a very small current, about 0.3 µA each, because they will all be well below their respective threshold voltages. Therefore, the total leakage from all 32 cells before the voltage pulse will be about 9 µA. In the above example, the amorphous threshold-type, PC-material portion 504, which is thick, will result in a small read current increase on the bit line 112 from about 9 µA to about 10 µA, when the voltage pulse is applied to the target word line, e.g. word line 152. But, the amorphous threshold-type, PC-material portion 514, which is thin, will result in a large read current increase on the bit line 112 from about 9 µA to about 109 µA, when the voltage pulse is applied to the target word line, e.g. word line 552. Based on this read current flow, the sense-amplifier circuit will determine whether the memory cell 102 contained a "1" bit, or "0" bit, data state. Also, the read margin should be adequate, because only 32 cells are connected to the bit line 112 and the total leakage is small compared to the read current from the single cell, e.g. memory cell 102, above threshold.

In accordance with an embodiment of the present invention, parallel reading can be accomplished by simply applying 0 V to more than one tree structure in a tree column and employing the use of more than one sense-amplifier circuit. For example, every sixteenth tree structure in a column might be brought to 0 V and 32 sense-amplifier circuits employed to read out the data states from 32 memory cells, as 32 bits, simultaneously. For this example, the maximum current on the word line would be higher, up to about 3.3 mA, if all 32 memory cells had amorphous threshold-type, PC-material portions, which were thin. Thus, the degree of parallelism employed would depend on the current delivery capacity of the word-line-driver transistor connected to the word line.

In yet another embodiment of the present invention, an alternative method might be used to read the memory cell 102. Alternatively, the first voltage impressed on the tree structures accessed by the tree-access transistors might be V/3; the second voltage applied to all word lines on a tree column, e.g. the column 340, might be 2V/3; the third voltage applied to the target tree-row line, e.g. bit line 112, to set the target tree structure, e.g. tree structure 106, at the third voltage might be V; and, the fourth voltage used to pulse the memory cell applied through the word line to which the memory cell 102 is connected might be 0 V. It should be appreciated that this latter method effectively reverses the direction of read current flow through the circuit containing the memory cell, as well as other elements in the circuit path with the memory cell. Thus, the utility of FETs in the memory-circuit path having source/drains is realized. Also, an arbitrary offset voltage may be added to all values discussed above without altering the operation of the memory device since only voltage differences influence the operation.

Figure 8:
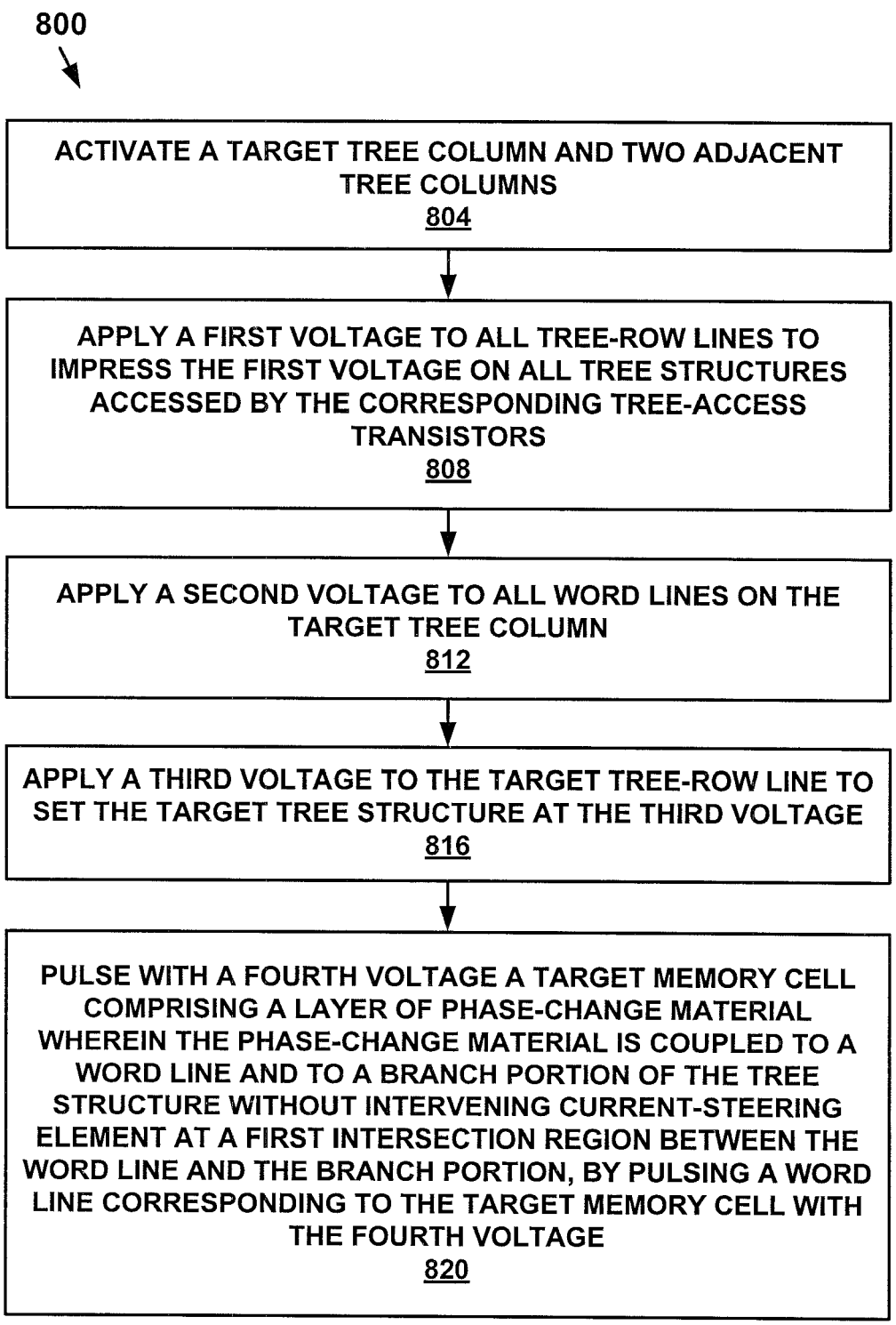
FIG. 8 is flow chart illustrating an embodiment of the present invention for writing a data state to a threshold-type, PCM cell.

Description of Embodiments of the Present Invention for a Method of Writing Data States Stored to a Threshold-Type PCM Cell With reference to FIG. 8, in accordance with an embodiment of the present invention 800, a first method for writing the memory cell 102 is next described. Writing would be very similar to reading except voltage pulses with larger pulse amplitudes, and longer pulse-duration times are used, as per the description of FIG. 6 given above. For example, instead of 1.25 volts, V would be 1.75 volts to write to the memory cell 102 a data state corresponding to an amorphous threshold-type, PC-material portion, which is thin, or 2.25 volts to write to the memory cell 102 a data state corresponding to an amorphous threshold-type, PC-material portion, which is thick (see FIG. 6). It should be appreciated that the value of voltage V is between the upper threshold voltage and three times the lower threshold voltage. For example, the value of V might be between about 1.5 volts and 2.5 volts. On the other hand, in the case of an embodiment of the present invention using more than two data bit states, the value of voltage V between an upper threshold voltage and three times a lower threshold voltage would be respectively between threshold voltages associated with a highest threshold voltage and three times a lowest threshold voltage for a plurality of data bit states greater than two stored in memory cells. As previously described, these relatively low voltages used for writing can be achieved with the use of a TIB layer adjacent to the threshold-type, PC-material layer. To write the memory cell 102, a target tree column, e.g. tree column 340 (shown in FIG. 3), and two adjacent tree columns, e.g. tree columns 346 and 342, are activated 804. The tree columns 340, 342 and 346 are activated by bringing the corresponding three tree-column-select lines, e.g. 134 and 236 (shown in FIG. 2), and the tree-column-select line, shown serving as gate 132, high to turn on the corresponding tree access transistor 124. A first voltage may be applied 808 to all tree-row lines, e.g. bit lines, to impress the first voltage on all tree structures accessed by the corresponding tree-access transistors; the first voltage may have a value of 2V/3, where V is the full voltage to be applied across the memory cell 102 being written. With reference to FIG. 3, tree structures that have been impressed with a first voltage 2V/3 appear with vertical striations. Thus, 2V/3 is impressed on the tree structure 106, connected to tree-access transistor 124 that contains the memory cell 102.

With further reference to FIG. 8, a second voltage is applied 812 to all word lines on the target tree column, e.g. tree column 340, containing the tree structure 106 with the memory cell 102; the second voltage may have a value of V/3. With reference to FIG. 3, word lines with an applied second voltage of V/3 appear with diagonal striations, e.g. word lines 156, 160 and 164. For the case of the memory design shown in FIG. 1, 32 word lines are brought to this second voltage. After applying the first and second voltages as described above, a third voltage is applied 816 to the target tree-row line, e.g. bit line 112 (shown in FIG. 2), to set the tree structure 106 with the memory cell 102 at the third voltage; the third voltage may have a value of 0 V. With reference to FIG. 3, target tree structure, e.g. tree structure 106, having an applied third voltage of 0 V appears with dark cross-hatching. To apply this third voltage to the target tree-row line, e.g. bit line 112, a virtual ground sense-amplifier circuit, located in the sub-array 316 of the third array, may be used that is electrically connected to the end of the target tree-row line, e.g. bit line 112. Next, memory cell 102 is pulsed 820 with a fourth voltage by applying the fourth voltage to the target word line 152 to which the memory cell 102 is electrically connected; the fourth voltage may have a value of V, and the pulse-duration time may have a value between about 1 ns and about 100 ns when writing the memory cell 102. It should be appreciated that the pulse-duration time of the write pulse during the write operation depends on a variety of factors: whether the physical state of the PC material in the memory cell is fully crystalline, which requires long pulses, up to about 100 ns; whether the physical state of the PC material in the memory cell is partially amorphous starting with a thick amorphous portion and transforming to a thin amorphous portion, which requires the use of longer pulses up to about 50 ns to allow recrystallization of amorphous material; whether the physical state of the PC material in the memory cell is partially amorphous starting with a thin amorphous portion and transforming to a thick amorphous portion, which allows the use of shorter pulses down to about 10 ns or less to allow rapid quenching of the melt zone to form amorphous material; and, the speed of the write electronics, which affects how long a pulse is required to compensate for the time-constant of the write circuit.

With reference to FIG. 3, word line 152 having been raised to an applied fourth voltage V appears with a checker-board pattern. In an embodiment of the present invention, the memory cell 102 comprises a layer of threshold-type PC material wherein the threshold-type PC material is coupled to the word line 152 and to the branch portion 116 of the tree structure 106 without an intervening current-steering element at a first intersection region between the word line 152 and the branch portion 116. The preceding operation should bring the full voltage V across the memory cell 102, located where word line 152 with the checker-board pattern crosses the branch portion 116 with the dark cross-hatching (as shown in FIG. 3), while other memory cells have at most V/3 applied across them.

In accordance with an embodiment of the present invention for writing the memory cell 102, the maximum voltage across unselected memory cells would be 0.75 volts, which is well below the threshold voltage for memory cells with amorphous threshold-type, PC-material portions, which are thin, the threshold for memory cells with amorphous threshold-type, PC-material portions, which are thick, being higher. Parallel writing would be accomplished in the same manner as for parallel reading, e.g. by writing to multiple cells along the same word line 152. Alternatively, parallel writing might also be accomplished by writing within the same tree structure 106 as next described.

Following the writing method described above in FIG. 8, more than one word line might be pulsed to V; alternatively, in the first method for writing the memory cell 102 described above, the voltage V might be applied to multiple word lines, with the tree structure 106 being subsequently pulsed with 0 V. It should be appreciated that the ability to write multiple bits in the same tree structure 106 would depend on the current carrying capacity of the tree-select transistor 124. A tree-select transistor 124 might, therefore, be made to carry a large current if fabricated with a wide channel, or with multiple gates having tall or multiple channels. Alternatively, increased current might be supplied by dual tree-access transistors electrically connected to the tree trunk 114 disposed on opposite sides of the tree trunk 114. In embodiments of the present invention, significant area under the tree-structure, about 40 $F^2$, allows for the fabrication of tree-access transistors with large current-carrying capacity.

In accordance with another embodiment of the present invention, a tree-select transistor having large current-carrying capacity might also be used to initialize the threshold-type PCM after fabrication, if not already in an amorphous state. For example, even though the PC-material layer may be in an amorphous state as-deposited, subsequent processing of the wafer on which devices are fabricated may cause the amorphous threshold-type, PC material to crystallize depending on the temperatures used in the fabrication process. The crystallization of the threshold-type, PC-material layer will cause shorts between the word and tree lines in the memory cells in which it occurs. Therefore, there may be a need to initialize memory cells with crystallized PC-material layers to create amorphous threshold-type, PC-material portions, which are either thin or thick, as required for programming of the PCM. Initialization of memory cells to an amorphous state might be accomplished by applying a voltage pulse to a tree structure while all word lines are held low. For example, if 150 µA is needed per memory cell to amorphitize the PC-material layer therein, initializing all 32 memory cells in a tree structure might require up to about 4.8 mA. Thus, a tree-select transistor with relatively large current-carrying capacity would be required to initialize a tree-structure in an initially crystalline state. The novel layout of the tree-type memory with 40 $F^2$ area under the tree structure facilitates the fabrication of such a large-current-carrying, tree-select transistor.

It should be appreciated that comparing embodiments of the present invention with today's leading rewritable semiconductor memory, NAND flash, both the embodiments of the present invention and NAND flash are capable of storing two bits per memory cell. However, in accordance with an embodiment of the present invention for making a tree-structure memory, after the first layer of the 3-D, threshold-type PCM is formed, only seven additional mask steps are required to form the next three layers, which increases chip memory capacity by a factor of four. In addition, the greater utility of threshold-type PCM over flash memory is further demonstrated by its faster programming speed; threshold-type PCM can be programmed in 10 ns compared to flash, which is 100,000 times slower. Moreover, threshold-type PCM is generally considered to be more scalable than flash memory. All of which demonstrates that the unique embodiments of the present invention have significant promise as a replacement for flash memory.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A tree-structure memory device, comprising:
    a plurality of bit lines formed on a substrate and arranged in at least one plane substantially parallel to a substrate surface and extending substantially in a first direction;
    a plurality of layers having a plurality of memory cells arranged in a first array; a tree structure corresponding to a plurality of layers and a bit line; and
    a word-line group comprising at least one word line crossing with said tree structure, a memory cell of said first array being located at said first intersection region in a layer of said layers,
    wherein said plurality of memory cells are connected by a phase-change-material line, and
    wherein said memory cell further comprises a pillar of a phase-change material.

2. The tree-structure memory device according to claim 1, wherein said word-line group is arranged in a second direction that is substantially perpendicular to a direction in which said branch portion extends.

3. The tree-structure memory device according to claim 1, wherein said tree structure comprises:
    a trunk portion and at least one branch portion corresponding to one of said layers, wherein said branch portion of said tree structure extends in a direction that is substantially parallel to said first direction.

4. The tree-structure memory device according to claim 1, wherein said tree structure comprises:
a plurality of tree structures arranged in a plurality of rows of tree structures that are substantially parallel to said first direction.

5. The tree-structure memory device according to claim 4, comprising:
adjacent memory cells on adjacent rows of tree structures and of adjacent word lines of said word-line group are arranged on a spacing of 2F×2F.

6. The tree-structure memory device according to claim 1, comprising:
a first plurality of said tree structures is arranged in a first tree column and a trunk portion of said tree structure in said first tree column is displaced from a first adjacent trunk portion of a first adjacent tree structure in said first tree column by a spacing of 4F;
wherein a second plurality of said tree structures are arranged in a tree row and said trunk portion of said tree structure in said tree row is located in said first tree column and a second adjacent trunk portion of a second adjacent tree structure in an adjacent tree row is located in a second tree column;
wherein said trunk portion of said tree structure in said tree row located in said first tree column is offset from said second adjacent trunk portion of said second adjacent tree structure in said adjacent tree row located in said second tree column along said first direction by half a distance between said first tree column and a third adjacent tree column in said tree row.

7. The tree-structure memory device according to claim 1, further comprising:
a plurality of word-line-driver transistors arranged in a second array, and a connection being formed between said word line and said word-line-driver transistor corresponding to said word line.

8. The tree-structure memory device according to claim 1, further comprising:
a plurality of tree-column-select lines formed on said substrate, extending in a direction that is substantially perpendicular to said first direction;
a plurality of tree-access transistors electrically connected to a plurality of trunk portions of a plurality of tree structures;
said plurality of tree-column-select lines overlapping said plurality of tree-access transistors at a plurality of second intersection regions, said second intersection region corresponding to said tree structure, said tree-column-select line further corresponding to a tree column; and
a tree-access transistor of said plurality of tree-access transistors further being electrically disposed between said tree structure and said bit line corresponding to said second intersection region, said tree-access transistor electrically coupled to a gate that is electrically connected to said tree-column-select line corresponding to said second intersection region.

9. The tree-structure memory device according to claim 8, wherein said tree-column-select line is a read/write line and said tree-access transistor is a read/write transistor.

10. The tree-structure memory device according to claim 8, further comprising:
a sense-amplifier circuit connected to said bit line for determining and outputting a data state of said memory cell of said tree structure accessed by said tree-access transistor.

11. The tree-structure memory device according to claim 1, wherein said plurality of memory cells further comprises a lower memory cell disposed below said branch portion at said first intersection region and an upper memory cell disposed above said branch portion at said first intersection region.

12. The tree-structure memory device according to claim 1, wherein said plurality of memory cells further comprises a first memory cell with a first threshold voltage and a second memory cell with a second threshold voltage, wherein said first and said second threshold voltages are selected from a group consisting of a high threshold voltage corresponding to a "0" bit, data state and a low threshold voltage corresponding to a "1" bit, data state.

13. The tree-structure memory device according to claim 1, said memory cell further comprising:
a thermal insulating barrier layer adjacent to a threshold-type, phase-change-material portion of said phase-change-material layer of said memory cell.

14. A method for reading data from a tree-structure memory device, said method comprising:
activating a target tree column and two adjacent tree columns;
applying a first voltage to tree-row lines to impress said first voltage on tree structures accessed by corresponding tree-access transistors;
applying a second voltage to word lines on said target tree column;
applying a third voltage to a target tree-row line to set a target tree structure at said third voltage;
pulsing with a fourth voltage a memory cell comprising a layer of phase-change material; and
determining with a sense amplifier a data state of said memory cell by measuring a read current drawn by said memory cell.

15. The method recited in claim 14,
wherein said first voltage is a voltage 2V/3, said second voltage is a voltage V/3, said third voltage is a voltage 0 V, and said fourth voltage is a voltage V; and
wherein said pulse-duration time of said pulsing is less than about 100 nanoseconds.

16. The method recited in claim 15, wherein said voltage V is between an upper threshold voltage and a lower threshold voltage.

17. The method recited in claim 14,
wherein said first voltage is a voltage V/3, said second voltage is a voltage 2V/3, said third voltage is a voltage V, and said fourth voltage is a voltage 0 V.

18. The method recited in claim 17, wherein said voltage V is between an upper threshold voltage and a lower threshold voltage.

* * * * *